(12) United States Patent
Peregrym

(10) Patent No.: US 8,619,109 B2
(45) Date of Patent: Dec. 31, 2013

(54) REGISTERING PATTERNS OF FEATURES BY ADJUSTING THE PITCH OF IMAGE SWATHS

(75) Inventor: Greg Peregrym, New Westminster (CA)

(73) Assignee: Kodak Graphic Communications Canada Company, Burnaby (CA)

( * ) Notice: Subject to any disclaimer, the term of this patent is extended or adjusted under 35 U.S.C. 154(b) by 1101 days.

(21) Appl. No.: 12/596,842

(22) PCT Filed: Apr. 26, 2007

(86) PCT No.: PCT/IB2007/001090
§ 371 (c)(1),
(2), (4) Date: Oct. 21, 2009

(87) PCT Pub. No.: WO2008/132528
PCT Pub. Date: Nov. 6, 2008

(65) Prior Publication Data
US 2010/0084541 A1    Apr. 8, 2010

(51) Int. Cl.
*B41J 2/435*    (2006.01)
(52) U.S. Cl.
USPC ......................................... 347/245; 347/131

(58) Field of Classification Search
USPC ............................................... 347/245, 131
See application file for complete search history.

(56) References Cited

U.S. PATENT DOCUMENTS

| | | | |
|---|---|---|---|
| 5,517,359 A | 5/1996 | Gelbart | |
| 6,124,870 A * | 9/2000 | Morimoto | 347/131 |
| 6,242,141 B1 | 6/2001 | Phillips | |
| 6,957,773 B2 | 10/2005 | Gelbart | |
| 7,508,549 B2 * | 3/2009 | Tai et al. | 358/3.2 |
| 2004/0130613 A1 * | 7/2004 | To et al. | 347/245 |

FOREIGN PATENT DOCUMENTS

JP    2001-208990    8/2001

* cited by examiner

*Primary Examiner* — Daniel Hess
(74) *Attorney, Agent, or Firm* — Nelson Adrian Blish

(57) ABSTRACT

Methods are provided to image patterns on a media. A pitch of a repeating pattern of sub-regions is determined and an imaging head is operated which has an array of individually addressable channels to direct imaging beams to form an image swath on the media. The individually addressable channels are controlled to image the repeating pattern of features and the pitch of the repeating pattern of features is adjusted to equal substantially the pitch of the repeating patterns of sub-regions.

18 Claims, 24 Drawing Sheets

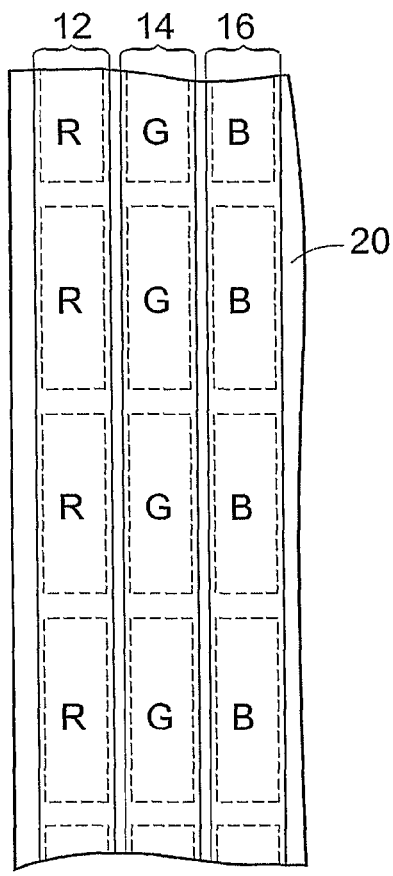
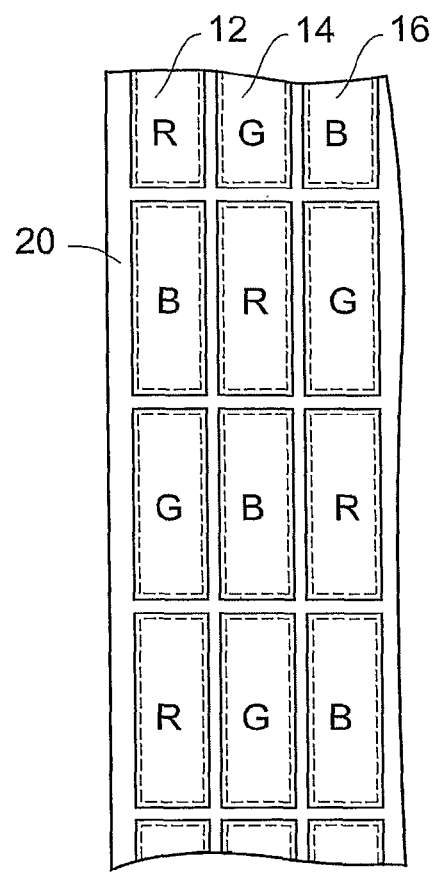
Figure 1C
PRIOR ART
Figure 1D
PRIOR ART

US 8,619,109 B2

REGISTERING PATTERNS OF FEATURES BY ADJUSTING THE PITCH OF IMAGE SWATHS

This is a U.S. National Stage application under 35 U.S.C. 371 of International Application No. PCT/IB2007/001090, filed Apr. 26, 2007.

TECHNICAL FIELD

The invention relates to imaging systems and to methods for imaging a plurality of patterns disposed on the same media. The invention may be applied to fabricating color filters for electronic displays, for example.

BACKGROUND

Color filters used in display panels typically include a matrix comprising a plurality of color features. The color features may include patterns of red, green and/or blue color features, for example. Color filters may be made with color features of other colors. The color features may be arranged in any of various suitable configurations. Prior art stripe configurations have alternating columns of red, green and blue color features as shown in FIG. 1A.

FIG. 1A shows a portion of a prior art "stripe configuration" color filter 10 having a plurality of red, green and blue color features 12, 14 and 16 respectively formed in alternating columns across a media or receiver element 18. Color features 12, 14 and 16 are outlined by portions of a matrix 20. The columns can be imaged in elongate stripes that are subdivided by matrix cells 34 (herein referred to as cells 34) into individual color features 12, 14 and 16. TFT transistors on the associated LCD panel (not shown) may be masked by areas 22 of matrix 20.

Laser-induced thermal transfer processes have been proposed for use in the fabrication of displays, and in particular color filters. When laser-induced thermal transfer processes are used to produce a color filter, a color filter substrate also known as a receiver element is overlaid with a donor element that is then image-wise exposed to selectively transfer a colorant from the donor element to the receiver element. Preferred exposure methods use radiation beams such as laser beams to induce the transfer of the colorant to the receiver element. Diode lasers are particularly preferred for their ease of modulation, low cost and small size.

Laser induced "thermal transfer" processes include: laser induced "dye transfer" processes, laser-induced "melt transfer" processes, laser-induced "ablation transfer" processes, and laser-induced "mass transfer" processes. Colorants transferred during laser-induced thermal transfer processes include suitable dye-based or pigment-based compositions. Additional elements such as one or more binders may be transferred, as is known in the art.

Some conventional laser imaging systems have employed a limited number of imaging beams. Other conventional systems have employed hundreds of individually-modulated beams in parallel to reduce the time taken to complete images. Imaging heads with large numbers of such "channels" are readily available. For example, a SQUAREspot® model thermal imaging head manufactured by Kodak Graphic Communications Canada Company, British Columbia, Canada has several hundred independent channels. Each channel can have power in excess of 25 mW. The array of imaging channels can be controlled to write an image in a series of image swaths which are closely abutted to form a continuous image.

The stripe configuration shown if FIG. 1A illustrates one example configuration of color filter features. Color filters may have other configurations. Mosaic configurations have the color features that alternate in both directions (e.g. along columns and rows) such that each color feature resembles an "island". Delta configurations (not-shown) have groups of red, green and blue color features arranged in a triangular relationship to each other. Mosaic and delta configurations are examples of "island" configurations. FIG. 1B shows a portion of a prior art color filter 10 arranged in a mosaic configuration in which color features 12, 14 and 16 are arranged in columns and alternate both across and along the columns. Other color filter configurations are also known in the art.

Each of color features 12, 14 and 16 may overlap adjoining portions of matrix 20. Overlapping matrix 20 with the color elements can reduce leakage of backlight between the elements. FIG. 1C schematically shows a conventional stripe configuration color filer in which the color features 12, 14 and 16 are formed from color stripes that fully overlap portions of matrix 20 along columns of the filter but partially overlap matrix 20 along the rows of the filter. FIG. 1D schematically shows a conventional mosaic configuration color filter in which each of the color features 12, 14 and 16 are islands that each partially overlap matrix 20 across both the rows and columns of the filter. In applications like color filters, the visual quality of the final product is dependant upon how accurately a repeating pattern of features (e.g. the pattern of color filter features) is registered with a repeating pattern of registration sub-regions (e.g. matrix). Misregistration can lead to the formation of undesired colorless voids and/or the overlapping of adjacent color features which can form an undesired color combination.

Overlapping a matrix may help to reduce the precision with which the color features must be registered with matrix. However, there typically are limits to the extent that a matrix can be overlapped. Factors that can limit the degree of overlap (and final registration) can include, but are not limited to: the particular configuration of the color filter, the width of the matrix lines, the roughness of the of the matrix lines, the minimum overlap required to prevent light back leakage, and post annealing color features shrinkage.

Factors associated with the particular method employed to produce the features can limit the degree of overlap. For example, when laser imaging methods are employed, the precision with which the laser imager can scan the color filter will be applicable to the final registration obtained. The addressability associated with the imaging channels of the imaging head defines the resolution with which the features can be imaged also has a bearing on the final registration. The orientation of the color filter with respect to a scan path of the imaging head can also have a bearing on the registration.

The laser imaging process employed can also have an effect on the degree of overlap that is permitted. For example, the visual quality of an image produced in a laser-induced thermal transfer process is typically sensitive to the amount of image forming material that is transferred from a donor element to a receiver element. The amount of transferred image forming material is typically sensitive to the spacing between the donor element and receiver element. If adjacent features of different colors overlap themselves over portions of the matrix, the donor-to-receiver element spacing will additionally vary during the subsequent imaging of additional donors elements, possibly impacting the visual quality of the features imaged with these additional donor elements. In this regard, it is preferred that adjacent features of different colors not overlap themselves over a matrix portion. This requirement places additional registration constraints on the required registration between the pattern of repeating color features and the repeating pattern of matrix cells.

To increase production throughput, a plurality of color filter displays is usually formed on a universal receiver element 18 and which is subsequently imaged with different color donor elements using laser-induced thermal transfer techniques to image the plurality of displays. Post-imaging, the universal receiver element 18 is separated to form the individual color filter displays. Although a matrix 20 can be produced on a receiver element 18 by laser-induced thermal transfer techniques, matrix 20 is typically produced by standard photolithographic methods. Photolithographic techniques typically employ an exposure apparatus to illuminate a mask to form a pattern on a substrate. Upon exposure the pattern is developed and a medium is transferred to the substrate via the pattern to form various entities such as matrix 20.

However, photolithographic techniques can become expensive when large universal substrates are exposed since both larger exposure units and masks are needed. To help mitigate these additional costs, smaller masks are employed with step and repeat exposure apparatus. A plurality of smaller masks are superposed over the substrate and imaged in a step and repeat fashion with smaller exposure units. Although these techniques may reduce the costs of forming multiple matrixes on a single universal substrate, additional problems may arise during the subsequent formation of the color features. For instance, the use of a plurality of masks may lead to varying degrees of misregistration between the multiple back matrixes that are formed. Misregistration between multiple matrixes create additional challenges in terms of accurately imaging a plurality of repeating color feature patterns in correct registration with their corresponding matrixes disposed on a universal receiver element.

There remains a need for effective and practical imaging methods and systems that permit the making of a plurality of high-quality images of repeating patterns of features, such as the patterns of color features in a color filter on a universal substrate.

There remains a need for imaging methods and systems that permit the making of a repeating patterns of features (e.g. the patterns of color elements in a color filter), in register with a repeating pattern of registration sub-regions (e.g. the pattern of cells in a matrix).

SUMMARY OF THE INVENTION

The present invention relates to a method for forming a repeating pattern of features in aligned relationship to a registration region which includes a repeating pattern of sub-regions, such as, for example, a pattern of color features on a receiver element. A computer program may be created to cause a controller to carry out the steps of the method. The receiver element may be, for example, a substrate including a matrix for a color filter. The receiver element may include a pattern of registration sub-regions, and those registration sub-regions may or may not be parallel to an axis of the array. The features may be offset from one another in more than one direction, and may be separated from each other in more than one direction. The features of one color may be separated by features of other colors in one or more directions.

The features may be formed using a laser-induced thermal transfer process, such as a laser-induced dye transfer process, or a laser-induced mass transfer process to transfer an image forming material from a donor element to the receiver element. The image may also be formed by transferring a colorant and a binder to the receiver element.

The method includes the steps of determining a pitch of the repeating pattern of sub-regions, operating an imaging head comprising an array of individually addressable channels to direct imaging beams to form an image swath, and/or an image line on the receiver element; while forming the image swath or image line on the receiver element, controlling the individually addressable channels to image the repeating pattern of features; and adjusting a pitch of the repeating pattern of features to equal substantially the pitch of the repeating patterns of sub-regions. The size of the image swath, or image line may be adjusted to adjust the pitch, or the effective pitch of the repeating pattern of features to equal substantially the pitch, or effective pitch of the repeating pattern of sub-regions. Alternatively, the size of a pixel may be adjusted to adjust the pitch of the repeating pattern of features to equal substantially the pitch of the repeating pattern of sub-regions.

In another embodiment, the size of the imaging beams may be adjusted to adjust the pitch of the repeating pattern of features to equal substantially the pitch of the repeating pattern of sub-regions. One way to adjust the image swath is to use a zoom mechanism. In yet another embodiment, the array of individually addressable channels may be rotated with respect to the repeating pattern of sub-regions to adjust the pitch of the repeating pattern of features to equal substantially the pitch of the repeating patterns of sub-regions. When the repeating pattern of sub-regions is skewed by an angle with respect to an axis of the array of individually addressable channels, the image head may be rotated to compensate for the angle.

BRIEF DESCRIPTION OF THE DRAWINGS

Embodiments and applications of the invention are illustrated by the attached non-limiting drawings. The attached drawings are for purposes of illustrating the concepts of the invention and may not be to scale.

FIG. 1C is a plan view of an orientation of color features with a matrix of a prior art color filter;

FIG. 1D is a plan view of an orientation of color features with a matrix of another prior art color filter;

DETAILED DESCRIPTION

Throughout the following description specific details are presented to provide a more thorough understanding to persons skilled in the art. However, well-known elements may not have been shown or described in detail to avoid unnecessarily obscuring the disclosure. Accordingly, the description and drawings are to be regarded in an illustrative, rather than a restrictive, sense.

Figure 2:
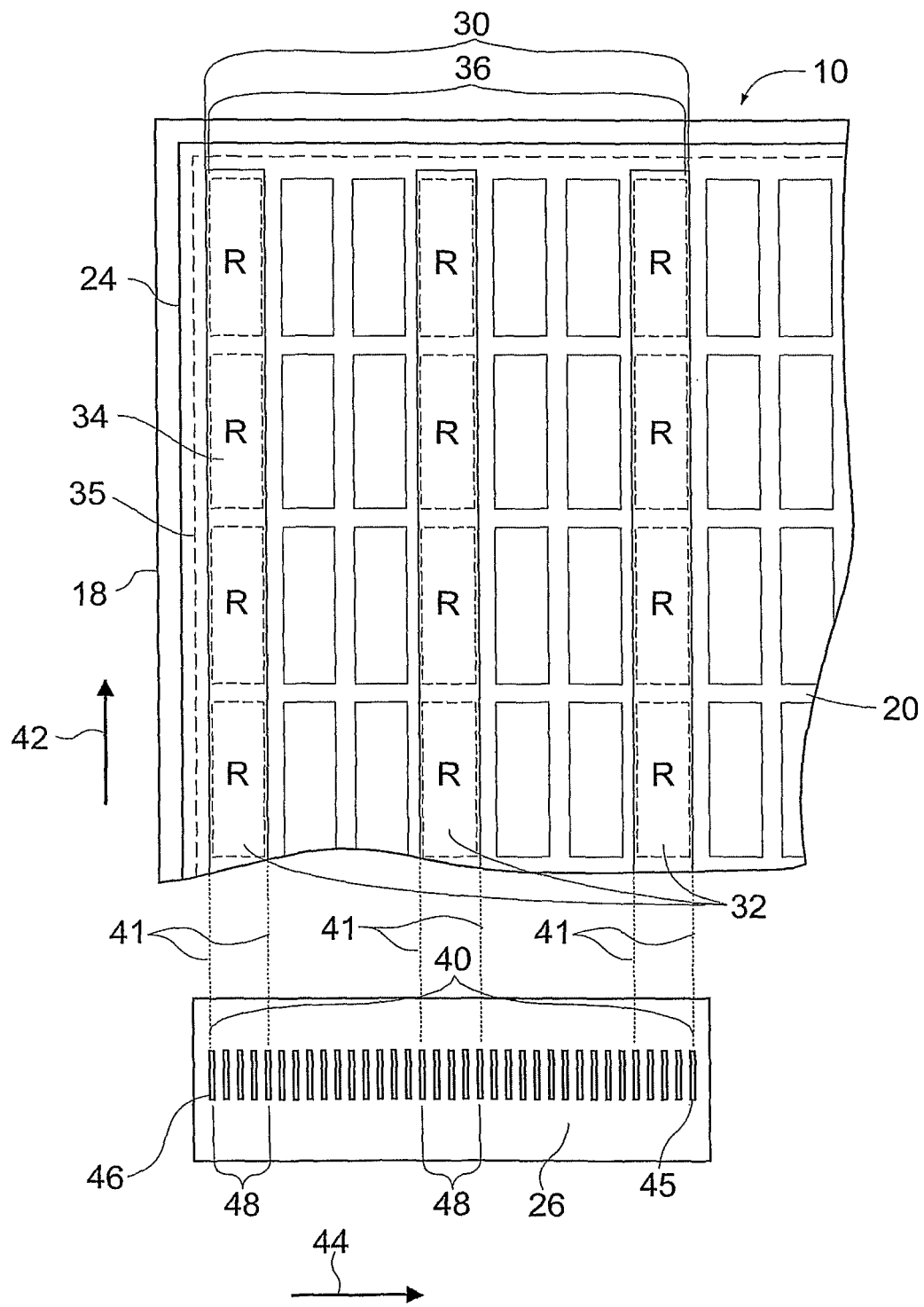
FIG. 2 is a schematic view of a multi-channel head imaging a pattern of features onto an imageable media.

FIG. 2 schematically shows a portion of a color filter receiver element 18 that has been conventionally patterned with a repeating feature pattern 30 of stripe features 32 (red in this example) in a laser-induced thermal transfer process. In this process, areas corresponding to the stripe features 32 are imaged on receiver element 18 by the transfer of the image-forming material (not shown) from donor element 24 onto receiver element 18. In FIG. 2 donor element 24 is shown as being smaller than receiver element 18 for the purposes of clarity only. Donor element 24 may overlap one or more portions of receiver element 18 as may be required.

For the sake of clarity, only red stripe features 32 are shown in FIG. 2. Different colored portions of filter 10 are typically imaged in separate imaging steps, each imaging step using a different color donor element appropriate for the color to be imaged. Each donor element 24 is removed upon completion of the corresponding imaging step. After the color features have been transferred, the imaged color filter may be subjected to one or more additional process steps, such as an annealing step for example, to change one or more physical properties (e.g. hardness) of the imaged color features.

The areas of receiver element 18 onto which the stripe features 32 are patterned are not chosen randomly. Rather, stripe features 32 are formed in substantial register with a registration region 35 (shown in broken lines) associated with receiver element 18. In this example, registration region 35 includes matrix 20 which is formed on receiver element 18. Matrix 20 includes a plurality of cells 34 which are arranged into a repeating registration pattern 36 of the cells. In this example, feature pattern 30 is "ideally" registered with registration pattern 36 with portions of stripe features 32 completely overlap portions of matrix 20 along a direction aligned with main-scan axis 42 and partially overlap other portions of matrix 20 along a direction aligned with sub-scan direction 44. The allowable amount of partial overlap in part defines the degree of registration between feature pattern 30 and registration pattern 36.

Image-forming material is image-wise transferred onto the receiver element 18 when imaging beams (not shown) emitted by imaging head 26 are scanned across donor element 24. Imaging head 26 includes an array of individually addressable imaging channels 40. The imaging beams generated by imaging head 26 are scanned over receiver element 18 in a main-scan direction 42 while being image-wise modulated according to image data specifying the pattern of features to be written. Groups 48 of channels are driven appropriately to produce imaging beams with active intensity levels wherever it is desired to form a feature. Channels 40 not corresponding to the features are driven so as not to image corresponding areas.

Figure 3:
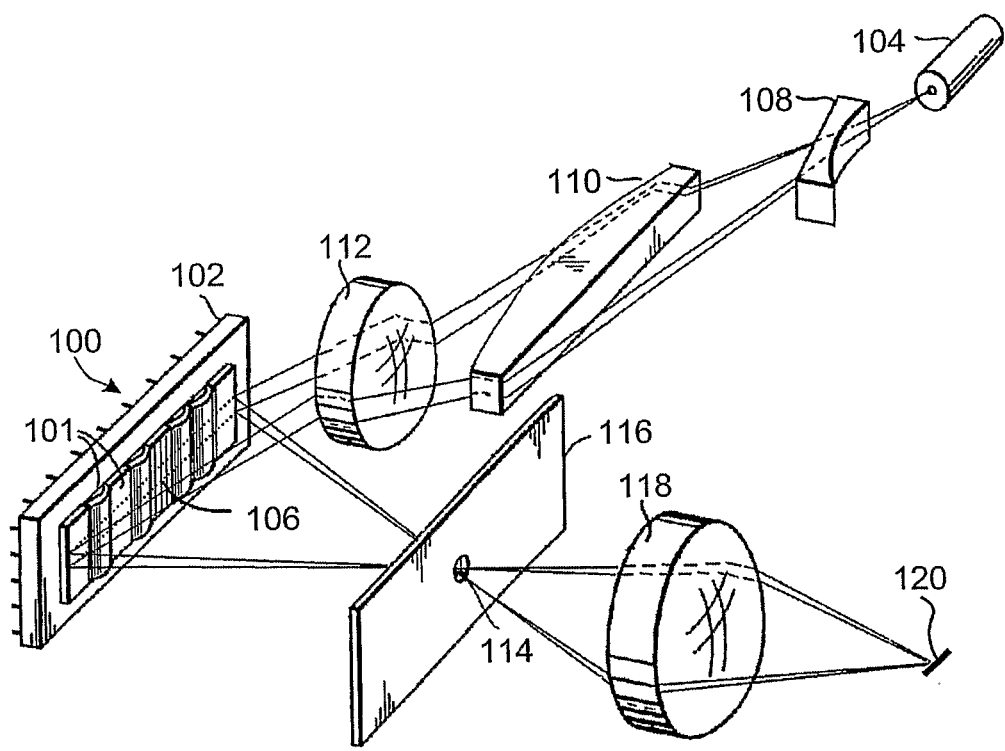
FIG. 3 is a partially schematic perspective view of the optical system of an example prior art multi-channel imaging head.

An example of an illumination system employed by a conventional laser-based multi-channel imaging head is schematically shown in FIG. 3. A spatial light modulator or light valve is used to create a plurality of imaging channels. In the illustrated example, linear light valve array 100 includes a plurality of deformable mirror elements 101 fabricated on a semi-conductor substrate 102. Mirror elements 101 are individually addressable. Mirror elements 101 can be micro-electro-mechanical (MEMS) elements, such as deformable mirror micro-elements, for example. A laser 104 can generate an illumination line 106 on light valve 100 using an anamorphic beam expander comprising cylindrical lenses 108 and 110. Illumination line 106 is laterally spread across the plurality of elements 101 so that each of the mirror elements 101 is illuminated by a portion of illumination line 106. U.S. Pat. No. 5,517,359 to Gelbart describes a method for forming an illumination line.

A lens 112 typically focuses laser illumination through an aperture 114 in an aperture stop 116 when elements 101 are in their un-actuated state. Light from actuated elements is blocked by aperture stop 116. A lens 118 images light valve 100 to form a plurality of individual image-wise modulated beams 120, which can be scanned over the area of a substrate to form an image swath. Each of the beams 120 is controlled by one of the elements 101. Each element 101 controls a channel of a multi-channel imaging head Each of the beams is operable for imaging, or not imaging, an "image pixel" on the imaged substrate in accordance with the driven state of the corresponding element 101. That is, when required to image a pixel in accordance with the image data, a given element 101 is driven to produce a corresponding beam with an active intensity level suitable for imparting a pixel image on the substrate. When required not to image a pixel in accordance with the image data, a given element 101 is driven to not produce an imaging beam. An imaging beam emitted by an imaging head channel can travel various paths to form a corresponding pixel. An imaging beam can be deflected along a path. As used herein, pixel refers to a single element of image on the substrate, as distinguished from the usage of the word pixel in connection with a portion of an image displayed on an assembled display device. For example, if the present invention is used to create a filter for a color display, the pixels created by the present invention will be combined with adjacent pixels, to form a single pixel of an image displayed on the display device.

Referring back to FIG. 2, receiver element 18, imaging head 26, or a combination of both are displaced relative to one another while the channels 40 of the imaging head 26 are controlled in response to image data to create imaged swaths. In some cases the image of imaging head 26 is stationary and receiver element 18 is moved. In other cases, receiver element 18 is stationary and imaging head 26 is moved.

Channels 40 of imaging head 26 can image a swath having a width related to the distance between a first pixel imaged by a first channel 46 and a last pixel imaged by a last channel 45. Receiver element 18 is typically too large to be imaged within a single swath. Therefore, multiple scans of each imaging head 26 are typically required to complete various images on receiver element 18.

Movement of imaging head 26 along sub-scan direction 44 may occur after the imaging of each swath is completed in main-scan direction 42. Alternatively, imaging head 26 may be translated relative to receiver element 18 along sub-scan direction 44 in synchrony. With a drum-type imager, it may be possible to simultaneously move imaging head 26 in both the main-scan direction 42 and sub-scan directions 44, thus writing the image in swath extending helically on the drum. Those skilled in the art will appreciate that there are other possible patterns of relative movement between imaging head 26 and receiver element 18 that could be used to image the desired imaging area on receiver element 18.

Any suitable mechanism may be applied to move imaging head 26 over a receiver element 18. Flat bed imagers are typically used for imaging receiver elements 18 that are relatively rigid, as is common in fabricating display panels. A flat bed imager has a support that secures a receiver element 18 in a flat orientation. U.S. Pat. No. 6,957,773 to Gelbart describes a high-speed flatbed imager suitable for display panel imaging. Alternatively, flexible receiver elements 18 may be secured to either an external or internal surface of a "drum-type" support to affect the imaging of the swaths. Even a receiver element that is traditionally thought of as rigid, such as glass, may be imaged on a drum-based imager provided that the substrate is sufficiently thin and the diameter of the support is sufficiently large.

FIG. 2 depicts an "idealized" correspondence between imaging channel groups 48 and the transferred pattern as broken lines 41. Features, such as stripe features 32 generally have dimensions in sub-scan direction 44 that are greater than the widths of pixels imaged by imaging channels 40. Such features may be imaged by turning on a group of channels that spans the width of the feature in sub-scan direction 44 while scanning the channels along a scan path. The correspondence between the channels groups 48 and stripe features 32 is idealized since in this example, channels 40 in channel groups 48 would need to form pixels of an ideal size that would lead to the formation of stripe features 32 with the correct size and periodicity to be correctly registered with matrix 20. The example shown in FIG. 2 is also idealized since the formation of image feature pattern 30 occurs while relative motion exists between head 26 and receiver element 18 along a scan path that is parallel to cells 34, thus facilitating the substantial registration of feature pattern 30 with matrix 20.

Ideal imaging conditions are not present however in many circumstances. Different articles of manufacture can have different registration patterns and different cell sizes. For example, the matrixes employed in computer applications typically have different cell sizes and periodicities than the matrixes employed in television applications. Such variances can make it difficult to address these different product configurations with a universal imaging system. Misorientation of registration patterns with the scan paths of the multi-channel imaging heads can also increase the difficulties associated with the accurately registering a repeating pattern of features with the repeating registration patterns. As further production throughput demands require that a plurality of multi-channel imaging heads be employed, additional burdens for the registrations requirements are additionally created.

Figure 1A:
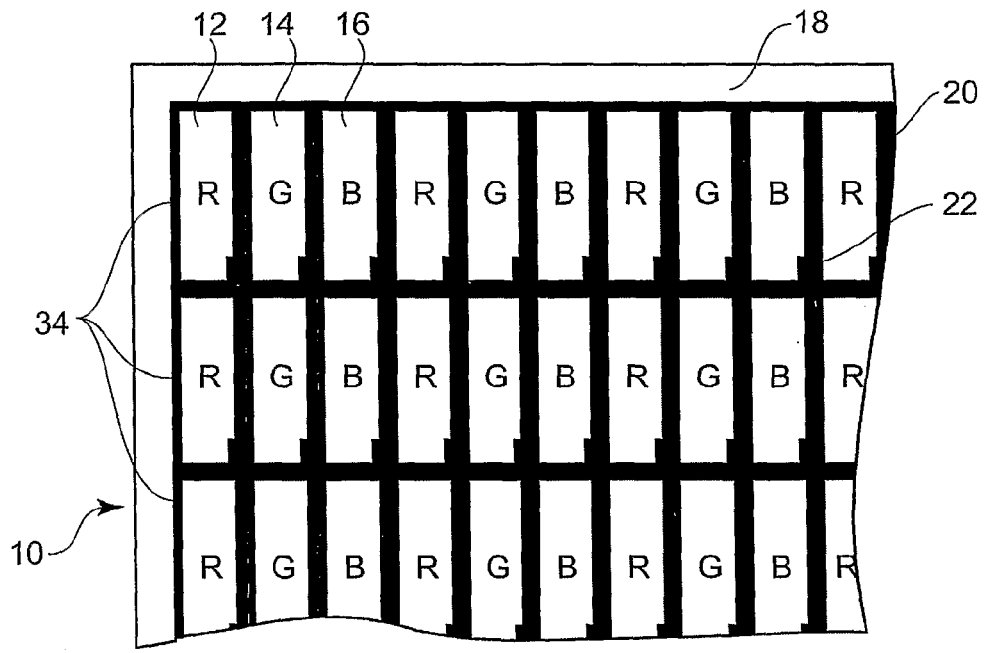
FIG. 1A is a plan view of a portion of a prior art color filter.
Figure 1B:
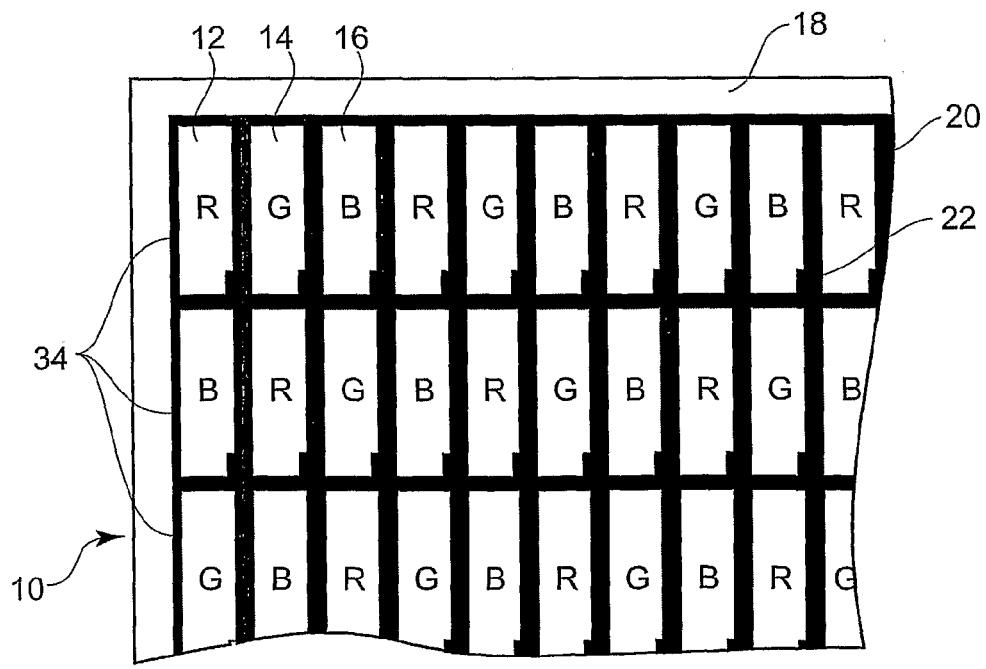
FIG. 1B is a plan view of a portion of another prior art color filter.
Figure 4:
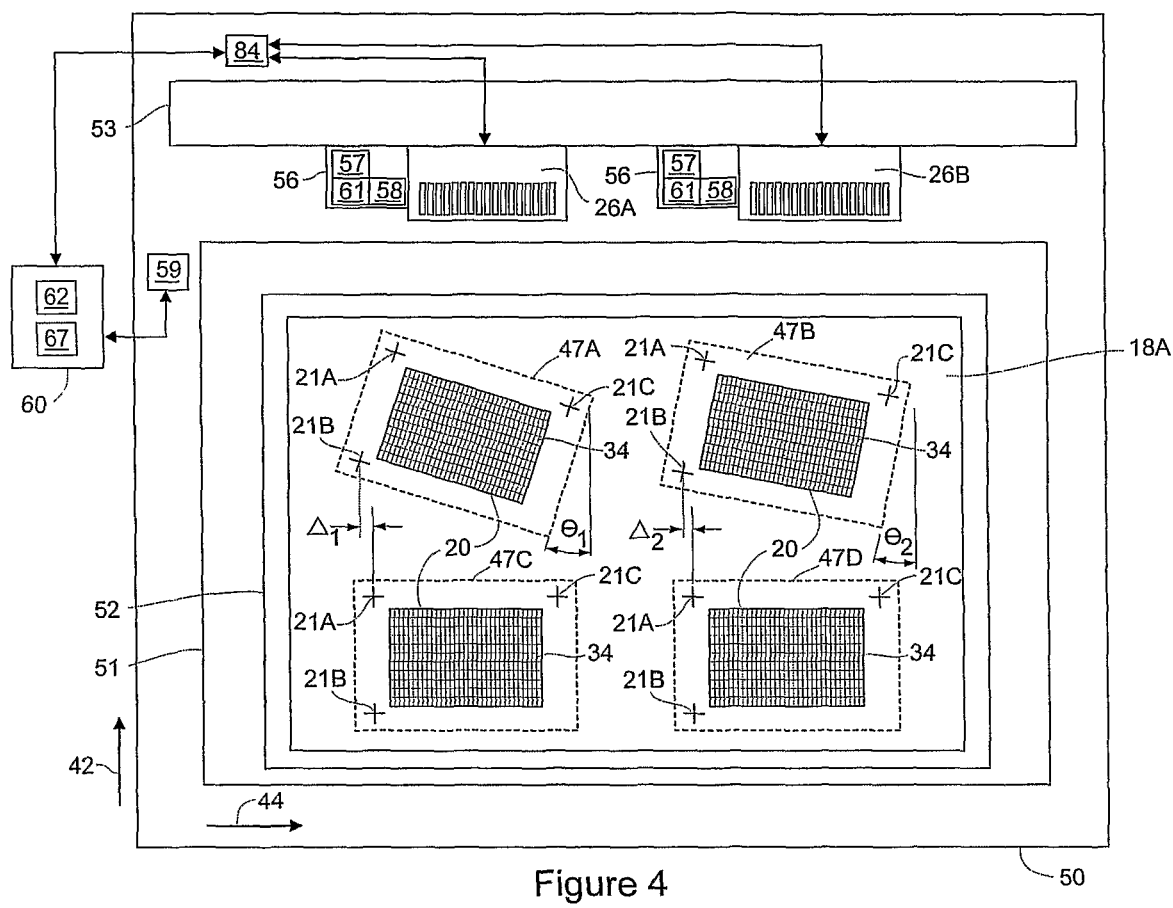
FIG. 4 is a schematic view of an apparatus used in an example embodiment of the invention.

FIG. 4 schematically shows an apparatus 50 used in an example embodiment of the invention. Apparatus 50 is operable for forming images on receiver element 18A. Receiver element 18A includes a plurality of registration regions 47A, 47B, 47C and 47D, which are collectively referred to as registration regions 47 and are shown in broken lines. In this example embodiment of the invention each registration region 47 includes a matrix 20. Each matrix 20 includes a plurality of cells 34. Cells 34 can be rectangular in shape as shown in FIG. 1A or any other suitable shape required by a given color filter configuration. In this example embodiment, matrixes 20 also can include various registration marks. In this example, registrations marks 21A, 21B and 21C (collectively known as registration marks 21) are associated with each registration region 47. Registration marks 21 can include but are not limited to various registration indicia or fiducials. Registration marks 21 can include various graphical shapes suitable for registration purposes (e.g. crosses) and can be formed from the same materials and/or process that is employed to produce the matrixes 20 themselves. As shown in FIG. 4, three registration features 21 are associated with each matrix 20. In this example embodiment of the invention, each registration region 47 includes a plurality of registration marks 21 that can be used to define an orientation of the registration region with respect to receiver element 18A. In this example embodiment of the invention, several of the registration regions 47 have different orientations with respect to other registration regions 47.

When producing multiple numbers of color filters on one or more receiver elements, misalignment of the matrixes 20 with respect to one another can occur as shown in FIG. 4. Translational and rotational (i.e. skew) misalignment can arise between the various matrixes. Misalignment between the various matrixes 20 can arise during the formation of the matrixes especially when step and repeat photolithographic techniques are employed. As shown in FIG. 4, registration region 47A is oriented at angle $\theta_1$ which differs from angle $\theta_2$ that registration region 47B is oriented to. Registration regions 47C and 47D are respectively laterally displaced from registration regions 47A and 47B by distance $\Delta_1$ and $\Delta_2$ ($\Delta_1$ differing from $\Delta_2$). The magnitudes of angles $\theta_1$, $\theta_2$, and displacements $\Delta_1$ and $\Delta_2$ are emphasized for the sake of clarity. In various example embodiments of the invention, the magnitudes may be smaller. For instance, in color filter application, misalignment between a plurality of matrixes formed on a receiver element can typically be measured in microradians and microns. Nonetheless, even such small misalignments between various registration regions can hamper efforts to accurately register a repeating pattern of features with a repeating pattern of registration sub-regions defined within the registration regions.

In this example embodiment of the invention, images are formed on receiver element 18A by a laser-induced thermal transfer process. Receiver element 18A is positioned on carrier 51 which includes a template 52 that allows receiver element 18A to be approximately aligned and positioned within a predetermined area of carrier 51. Template 52 is slightly larger than receiver element 18A in size. Carrier 51 is operable for conveying receiver element 18A along path aligned with main-scan direction 42. A plurality of multi-channel imaging heads 26A and 26B (collectively known as imaging heads 26) are arranged on a support 53. Each imaging head 26 is controlled to move independently of the other imaging head 26 along paths aligned with sub-scan direction 44. In this example embodiment of the invention, sub-scan direction 44 is substantially perpendicular to main-scan direction 42. In this example embodiment of the invention, each of the imaging heads 26 includes one or more vision systems 56 that move along paths aligned with sub-scan direction 44 in accordance with their respective imaging heads 26. In this example embodiment vision system 56 includes a CCD camera 57, and flash 58. CCD camera 57 can include a CCD and associated optical elements to capture suitable images of receiver element 18A. In this example embodiment of the invention, the optical elements include a microscope 61. In this example embodiment of the invention, a donor element 24 (not shown in FIG. 4) is appropriately positioned on receiver element 18 and carrier 51 conveys the media assemblage along a path aligned with main-scan directions 42. During this motion, imaging heads 26 are controlled to scan the media assemblage with a plurality of radiation beams to cause a transferal of an image forming material (not shown) from donor element 24 to receiver element 18A to form images on receiver element 18A. Imaging electronics 84 control the activation of the imaging channels of each imaging head 26 to regulate the emission of the radiation beams. In this example embodiment of the invention, each registration region 47 is imaged by a single imaging head 26, although it is understood that each registration region 47 can be imaged by a plurality of imaging heads and therefore any suitable number of imaging heads can be used in other embodiments of the invention.

Motion system 59 which can include one or more motion systems that include any suitable prime movers, transmission members, and/or guide members causes the motion of carrier 51. In this example embodiment of the invention motion system 59 also controls the independent motion of each of imaging heads 26A and 26B along corresponding paths aligned with sub-scan direction 44. Those skilled in the art will readily realize that separate motion systems can also be used to operate different systems within apparatus 50.

Controller 60, which can include one or more controllers is used to control one or more systems of apparatus 50 including but not limited to various motion systems 59 used by carrier 48 and imaging heads 26. Controller 60 can also control media handling mechanisms that can initiate the loading and/or unloading of receiver elements 18A and donor elements 24. Controller 60 can also transfer image forming data to the imaging heads 26 and control the imaging heads to emit imaging beams in accordance with this data. Controller 60 can also be used to control vision systems 56. These various systems can be controlled using various control signals and/or implementing various methods. Controller 60 may be configured to execute suitable software and may comprise one or more data processors, together with suitable hardware, including by way of non-limiting example: accessible memory, logic circuitry, drivers, amplifiers, A/D and D/A converters, input/output ports and the like. Controller 60 may comprise, without limitation, a microprocessor, a computer-on-a-chip, the CPU of a computer or any other suitable microcontroller. Controller 60 associated with the exposure systems described above may be, but need not necessarily be, the same controllers that control the operation of the corresponding materials handling systems.

Apparatus 50 forms images in each of the registration regions 47. In this example embodiment of the invention, apparatus 50 forms various color filter feature patterns (not shown). The visual quality of each of each of the color filter feature patterns alone or combined is dependant upon the ultimate registration between the formed images and the registration regions 47. In this example embodiment of the invention, the visual quality of each of the color filters is dependant upon the registration of the imaged color features with the matrix 20 of the corresponding color filter.

Many factors can affect imaging registration. For example, if a receiver element is made from glass, a temperature increase of 1 deg. Celsius can result in approximately 10 microns or more of expansion in receiver element. A typical matrix line width can be 20 microns or less, and such a degree of thermal mis-registration could lead to the presence of colorless voids or overlapping color elements, of which both effects diminish the quality of the final color filter.

The position of receiver element 18A with respect to template 52 can affect imaging registration. Although automation (e.g. robotic loaders) can be used to load a receiver element 18 within the confines of template 52, some degree of registration errors are very likely to occur. Misregistration of receiver element 18A with template 52 can include translational misregistration as well as rotational misregistration.

Before apparatus 50 can image each of the registration regions 47, the orientation of each of the registration regions 47 must be determined as referenced with the imaging directions (i.e. main-scan direction 42 and sub-scan direction 44). In this example embodiment of the invention, vision systems 56 are used to accurately locate registration regions 47.

Figure 5:
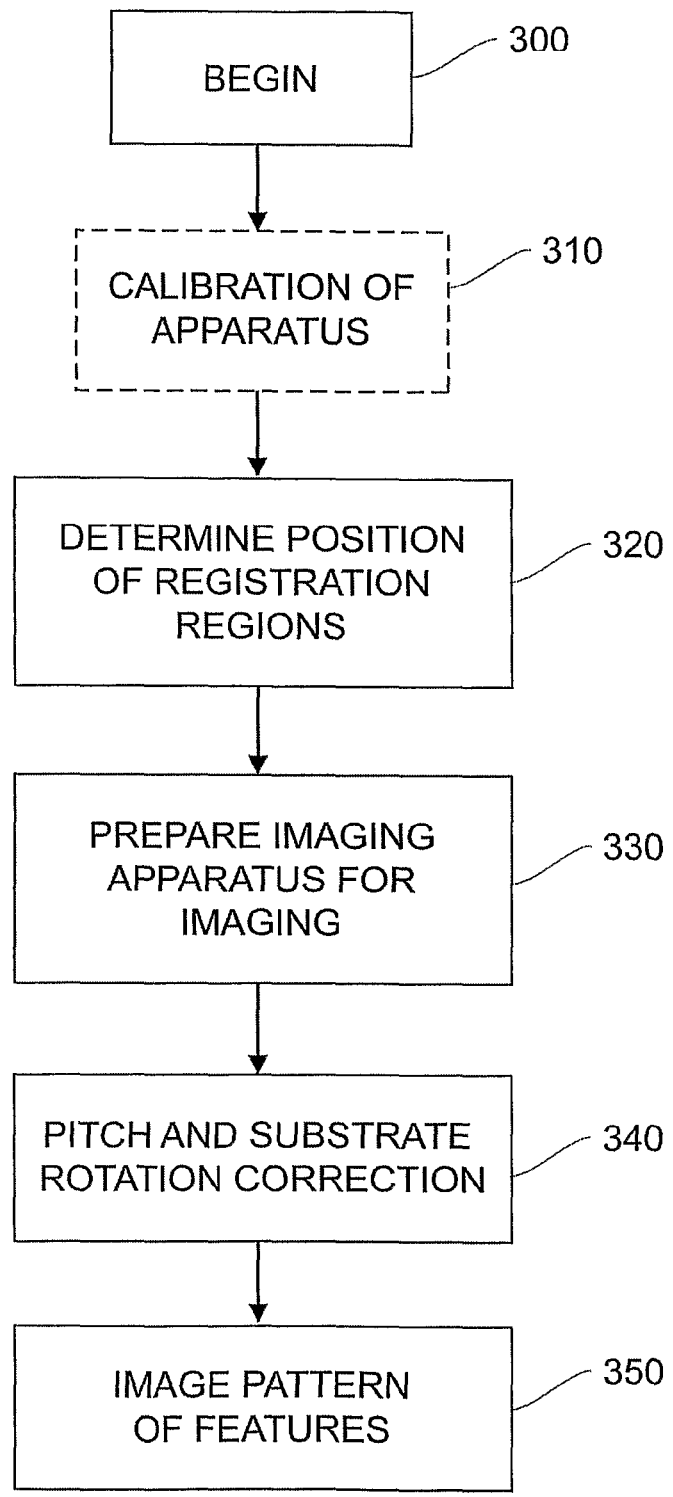
FIG. 5 is a flow chart for an imaging method of an example embodiment of the invention.

FIG. 5 shows a flow chart for determining the location of the registration regions 47 and forming images in the aligned relationship with registration regions 47 as per an example embodiment of the invention. It will be understood that the steps in FIG. 5 do not have to be performed in the order shown. For example, the pitch and substrate rotation correction can be performed before preparing the imaging apparatus for imaging. The FIG. 5 flow chart refers to apparatus 50 as schematically shown in FIG. 4, although it is understood that other apparatus are suitable for use with the illustrated process. The process begins at step 300 when registration region information 62 is provided to controller 60 to identify the location of each registration region 47. Registration region information 62 can include, but is not limited to the number of registration regions 47 present on the receiver element 18A, the number and type of registration marks 21 associated with each of the registration regions, the position of the registration marks 21 within their respective regions, the spacing between each of the respective registration regions, and any relevant matrix 20 information (e.g. the pitch spacing between matrix cells). Registration region information 62 can be provided in any suitable data entry form to controller 60.

In step 320, the actual position of each registration region 47 is determined. In this example embodiment of the invention, a hunt for each of the registration marks 21 associated with each of the registration regions 47 is made. Controller 60 provides signals to the motion systems 59 and vision systems 56 in accordance with the registration region information 62 to initiate this hunt. Controller 60 can receive feed back signals from motion systems 59 and vision systems 56.

In this example embodiment of the invention, flashes 58 and CCD cameras 57 are synchronized with motion systems 59. For example, when motion system 59 positions receiver element 18A under a given microscope 61, an associated flash 58 is triggered to generate an illuminating flash of light for a specific distance as CCD camera 57 captures an image during the positioning. As speed of the motion system increases, a brighter flash of light is triggered. In this example embodiment of the invention, imaging heads 26 and their associated vision systems 56 are positioned at various locations aligned with sub-scan directions 44. As motion systems 59 moves receiver element 18A along a paths aligned with main-scan direction 42 each vision system 50 capture as series of multiple images at specific determined points on receiver element 18A. This process is referred to as "dynamic capture".

Typically, since the field of view of each microscope 61 is small, apparatus 50 must perform a multi-image hunt for the registration marks 21 that define each registration region 47. A minimum of three non-colinear registration marks 21 are needed to define a position of each registration region 47 in a reference frame related to main-scan directions 42 and sub-scan directions 44. Geometric location software (e.g. Adept Hexsight, distributed by Adept Technologies, Inc. of Livermore, Calif.) is used to determine if, and where a registration mark 21 appears in each captured image. Inputs to this software typically include what each registration mark 21 looks like as well as the captured image coordinates.

In accordance with registration region information 62, controller 60 enables motion systems 59 to independently position each of the imaging heads 26 at various preliminary positions aligned with sub-scan direction 44. As shown in FIG. 4, imaging head 26A has been moved to a preliminary position with respect to registration regions 47A and 47C. Imaging head 26B has been moved to a preliminary position with respect to registration regions 47B and 47D. The hunt is expedited by first locating two of the three registration marks of each registration region 47. For example, registration marks 21A and 21B associated with each of registration regions 47A and 47C are located in a square search hunt in which imaging head 26A is moved to a first sub-scan position where its associated vision system 50 dynamically captures a column of images as receiver element 18A is moved along a path aligned with main-scan direction 42. Geometric location software is used to determine the existence and location of any of the registration marks 21A and 21B associated with each of registration regions 47A and 47B. If none or only part of these registration marks 21 are located, motion systems 59 positions imaging head 26A to a next sub-scan position and another column of images is dynamically captured and analyzed. This process is repeated until all of the registration features 21A and 21B corresponding to registration regions 47A and 47C are located.

Using the derived positional information for the first two registration features 21A and 21B, the location of the remaining registration feature 21C for each registration region 47A and 47C is determined. Using the registration region information 62 (which includes spacing information between the various registration features) and the determined locations of registration features 21A and 21B, controller 60 enables motion system 59 to move imaging head 26A to an estimated location in which the remaining registration feature 21C is placed in the center of a CCD camera's field of view with no hunting. The objective of this process is to capture images of the remaining registration features 21C as quickly as possible. In this regard the system will try to capture the remaining registration features 21C of each of registration regions 47A and 47C in a single pass of CCD camera 50 using dynamic capture. Images of registration features 21C can be captured by moving imaging head 26A and its corresponding vision system 56 to the estimated location or moving another vision system to the estimated location.

It is beneficial to determine the location of all the registration marks as quickly as possible. In this example embodiment of the invention, the location of the registration marks 21 corresponding to the registration regions 47B and 47D are determined by the vision systems 56 associated with imaging head 26B while the registration marks 21 corresponding to the registration regions 47A and 47C are being located.

In this example embodiment of the invention, the determined position of each set of the registration features 21 in turn determines the location and position of their corresponding registration regions 47. In other example embodiments of the invention, the location and orientation of each registration region can be determined by other methods. For example, the vision systems 56 can be used to determine the location and orientation of a matrix 20 within each registration region 47. Determining the location and orientation of a matrix 20 can include determining the location and orientations of portions of the matrix 20. Portions of the matrix 20 can include edges and/or corners of the matrix 20.

Step 310 includes an optional calibration routine (step 310 shown in broken lines) for apparatus 50. For example, the position of the imaging beams emitted by each of the imaging heads 26 are typically affected by changes in temperature both inside and outside of the imaging heads 26. As the temperatures of various components change over time, the directed imaging beams can wander. This effect is called "thermal drift". Calibration step 310 can adjust for thermal drift.

The location and orientation of each registration region 47 was determined in step 320 with the use of the vision systems 50. In this example embodiment of the invention, this step in turn defined the position and orientation of each matrix 20. The visual quality of the resulting color filers is dependant on the accurate transfer of image forming material from a donor element 24 to specific areas defined by the various cells 34. To determined how to move each of the imaging heads 26 so that they can accurately image the specific areas, the positional relationship between the imaging beams and the field of view the CCD cameras 57 must be determined for each imaging head 26. Those skilled in the related art will realize that thermal drift can alter these positional relationships. In this example embodiment of the invention, these positional relationships are determined based on a reference frame related to main-scan direction 44 and sub-scan direction 42.

Figure 6:
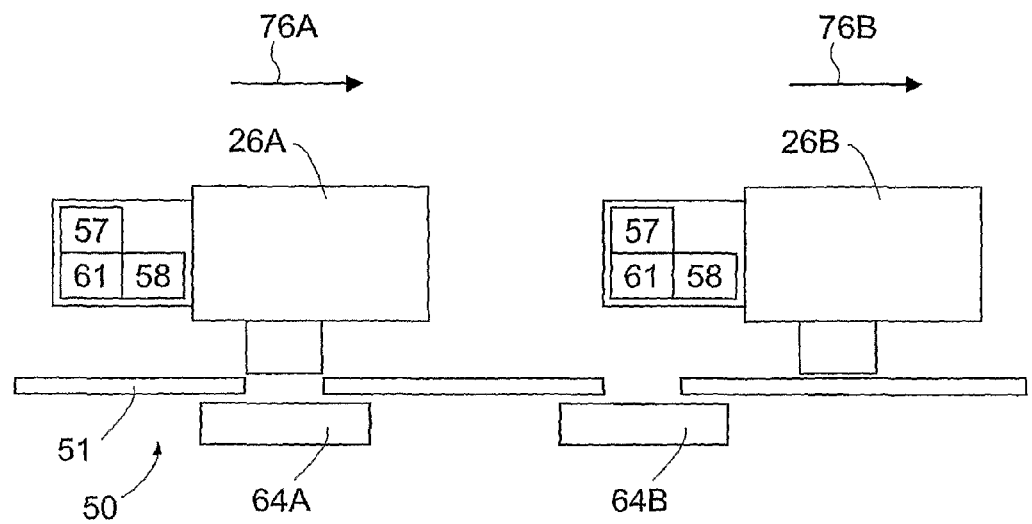
FIG. 6 is schematic cross-sectional view of the apparatus of FIG. 4.

In an example embodiment of the invention, the positional relationship is determined using beam finders 64. FIG. 6 schematically shows a partial cross-sectional view of apparatus 50. In this example embodiment of the invention a plurality of beam finders 64 (i.e. beam finder 64A and beam finder 64B). Although a single beam finder 64 can be used, a plurality of beam finders 64 allow for the calibration of a multiplicity of imaging heads 26 in a time efficient manner. Beam finders 64A and 64B are located under carrier 51 which is used to support receiver element 18A (not shown).

Figure 7:
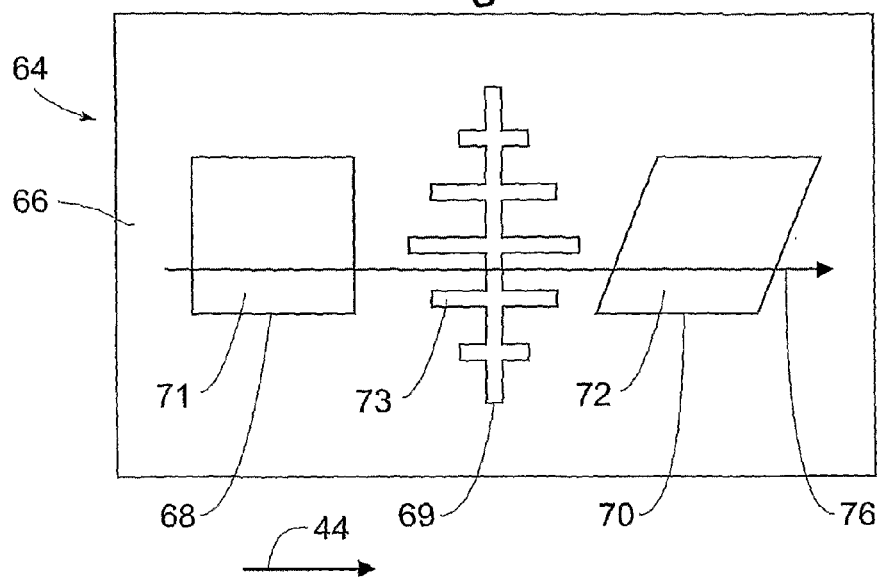
FIG. 7 is a beam finder used in an example embodiment of the invention.

FIG. 7 shows beam finder 64 as per an example embodiment of the invention. Beam finder 64 includes a mask 66 that defines areas that include a sub-scan positional target 68, a camera target 69 and a main-scan positional target 70. Mask 66 can be produced by photo-lithographic techniques. In this example embodiment of the invention, sub-scan positional target 68 includes one or more regions 71 (one in this example) that are aligned transversely to sub-scan direction 44 and main-scan positional target 70 includes one or more regions 72 (i.e. one in this example) that are aligned at a predetermined angle to sub-scan direction 44. Photodiodes (not shown) are positioned in the vicinity of regions 71 and 72 and are responsive to emit various signals when imaged by radiation. Camera target 69 includes one or more regions 73 (one in this example). Light sources (not shown) are positioned in the vicinity of regions 73. Controller 60 is operable for activating the light sources to illuminate to illuminate region 73. The positions of sub-scan positional target 68, a camera target 69 and a main-scan positional target 70 is accurately determined with respect to each other.

For each imaging head 26, the positional relationship between its imaging beams and the field of view its associated CCD camera 57 is determined by establishing relative movement between the imaging head 26 and carrier 51 in the vicinity of a beam finder 64. Referring to FIGS. 6 and 7, each imaging head 26 is moved along a respective path 76A or 76B aligned with sub-scan direction 44 while imaging associated beam finders 64 with one or more imaging beams (not shown). As the one or more imaging beams are moved across each beam finder, the photodiodes located in the vicinity of sub-scan positional target 68 and main-scan positional target 70 are sampled. As the one or more imaging beams are moved across sub-scan positional target 68, signals from the sampled photodiodes will have intensity levels defined by a first peak 74 that corresponds to a sub-scan position of the one or more beams. As the one or more imaging beams are moved across main-scan positional target 70, signals from the sampled photodiodes will have intensity levels defined by a second peak 75 that corresponds to a main-scan position of the one or more beams. An example of first peak 74 and second peak 75 are shown schematically in FIG. 8.

Figure 8:
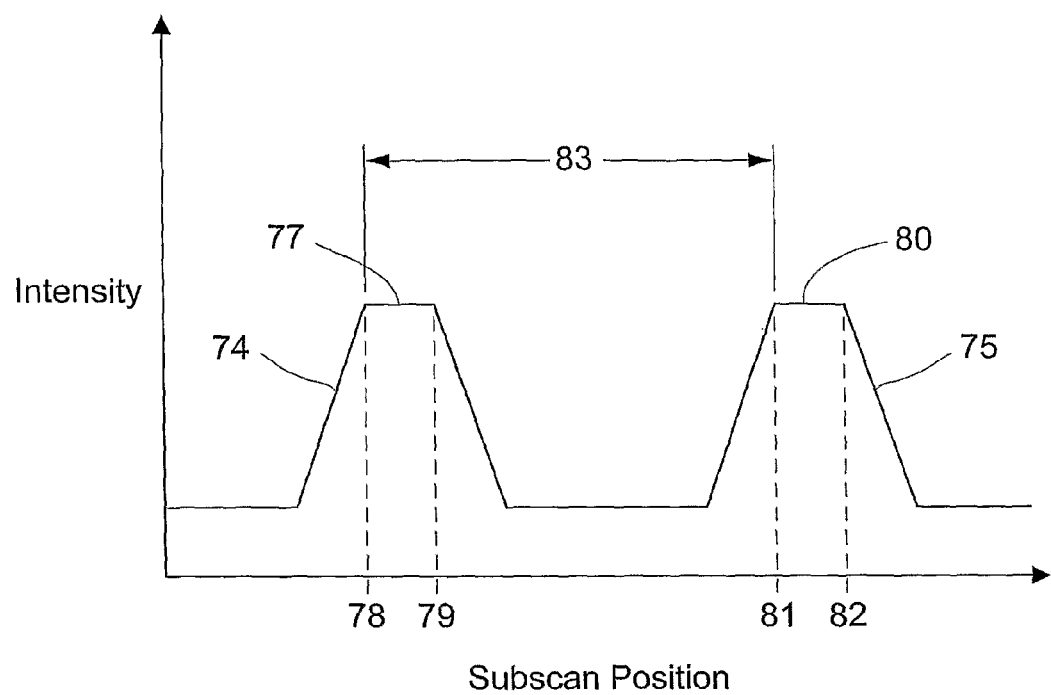
FIG. 8 is schematic representation of an intensity profile created by directing radiation beams on the beam finder of FIG. 7.

FIG. 8 schematically shows a first peak 74 that includes an intensity plateau 77. The start and end of the intensity plateau are defined by sub-scan points 78 and 79 respectively. Sub-scan point 78 corresponds to a sub-scan position of the imaging head 26 in which all of the radiation emitted by its one or more imaging beams is first captured by the photodiodes associated with sub-scan positional target 68. Sub-scan point 79 corresponds to sub-scan position of the imaging head 26 in which all of the radiation emitted by its one or more imaging beams is last captured by the photodiodes associated with sub-scan positional target 68. Signals provided by sub-scan encoders of motion system 59 are used by controller 60 to thereby accurately determine the sub-scan position of the one or more imaging beams.

FIG. 8 schematically shows a second peak 75 that includes an intensity plateau 80. The start and end of the intensity plateau are defined by sub-scan points 81 and 82 respectively. Sub-scan point 81 corresponds to a sub-scan position of the imaging head 26 in which all of the radiation emitted by its one or more imaging beams is first captured by the photodiodes associated with main-scan positional target 70. Sub-scan point 82 corresponds to a sub-scan position of the imaging head 26 in which all of the radiation emitted by its one or more imaging beams is last captured by the photodiodes associated with main-scan positional target 70. Controller 60 analyses signals provided by sub-scan encoders of motion system 59 representative of these sub-scan positions and determines a distance 83 between the first and second peaks 74 and 80. Distance 83 varies as a function of the main-scan position in which the one or more imaging beams crossed the main-scan positional target 70. By comparing the distance 83 with the varying spacing between rectangular shaped region 71 and parallelogram shaped region 72, controller 60 can thereby determine the main-scan position of the one or more imaging beams.

After the sub-scan and main-scan positions of the one or more imaging beams have been determined, controller 60 illuminates camera target 69, CCD camera 57 and microscope 61 are used to locate camera target 69 and signals provided by sub-scan and main-scan encoders of motion system 59 are used by controller 60 to thereby accurately determine the position of CCD camera 57 at this location. Controller 60 can then establish positional relationships between the imaging beams and CCD camera of each imaging head 26.

The mechanical alignment of various additional components in apparatus 50 is not perfect. For example, support structures may not be perfectly true, and position encoders are not perfectly accurate. To compensate for these and other imperfections, calibration step 310 can account for them. The imperfections can be measured and a device correction map including a two dimensional matrix of offsets from measured location to a true location can be determined for each imaging head 26.

Referring back to FIG. 5, step 330 prepares apparatus 50 for imaging. The location and orientation of each of the registration regions 47 has been determined in step 320. In step 330 one or more "placement correction maps" are generated by controller 60 for each imaging head 26. The placement correction maps are similar to the device correction maps except that they compensate for the placement of receiver element 18A placement within template 52 and any skew associated with registration regions 47 instead of device inaccuracies. Controller 60 is used to combine the device correction maps and the placement correction maps to create a final set of correction map for each imaging head 26.

Each set of final correction map covers the entire two dimensional relative range of motion that each imaging head 26 will undergo. In an example embodiment of the invention, the final set of correction maps includes a sub-scan correction map and a main-scan correction map. The sub-scan correction map includes information that is communicated by controller 60 to motion system 59 to define a coordinated motion path for each imaging head 26. The main-scan correction map is sent to the imaging electronics 84 to set various timing delays for imaging beams emitted by imaging heads 26.

Figure 9A:
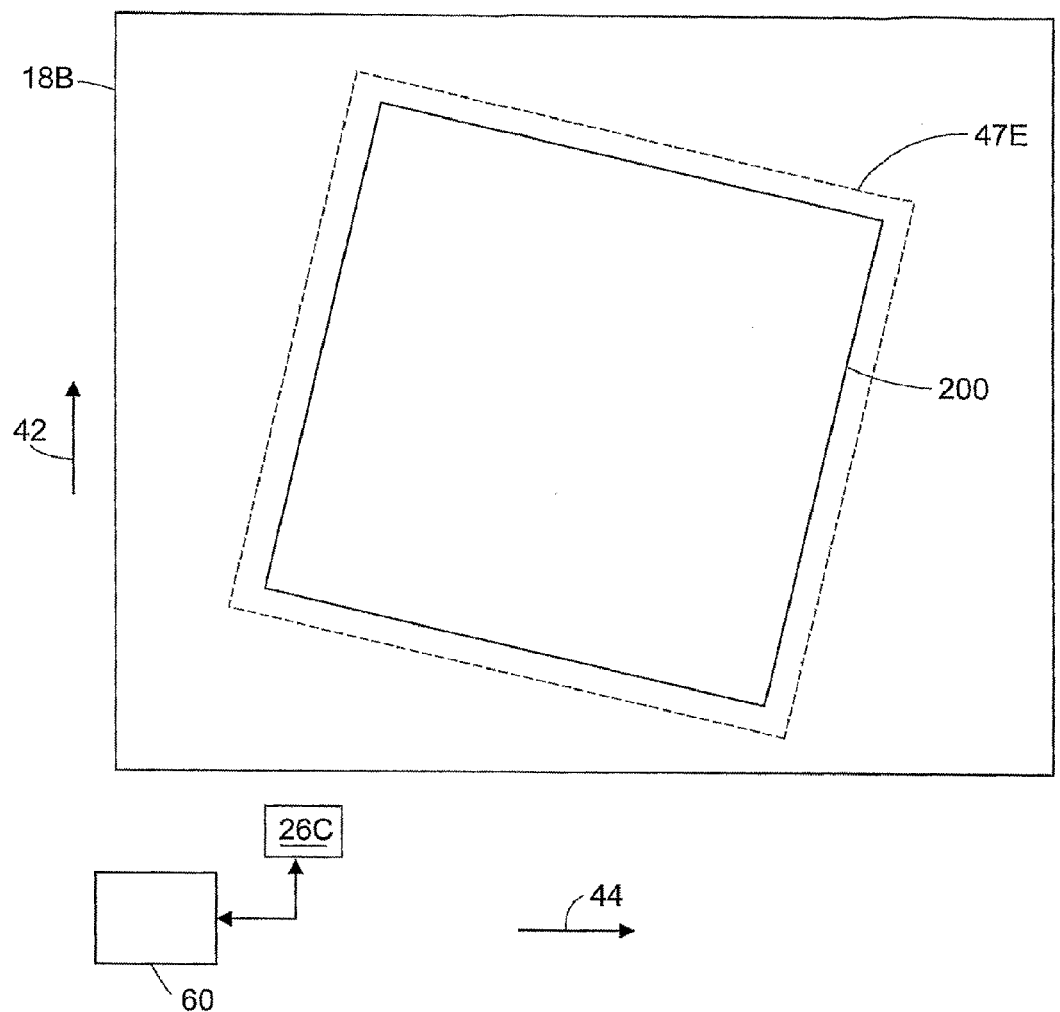
FIG. 9A is a schematic representation of a receiver element.

FIG. 9A schematically shows a receiver element 18B that includes a registration region 47E (shown in broken lines). Registration region 47E is skewed (i.e. the amount of skew has been exaggerated for the sake of clarity) with respect to both main-scan direction 42 and sub-scan direction 44. Multi-channel imaging head 26C (herein referred to as imaging head 26C) is movable along a path aligned with sub-scan direction 44 while receiver element 18B is movable along a path aligned with main-scan direction 42. In this case, it is desired that an image 200 be formed on receiver element 18B in register with registration region 47E (registration region 47E being shown as larger than image 200 for the sake of clarity). In this case, image 200 is in register with registration region 47E when its edges are parallel to corresponding edges of registration region 47E.

Figure 9B:
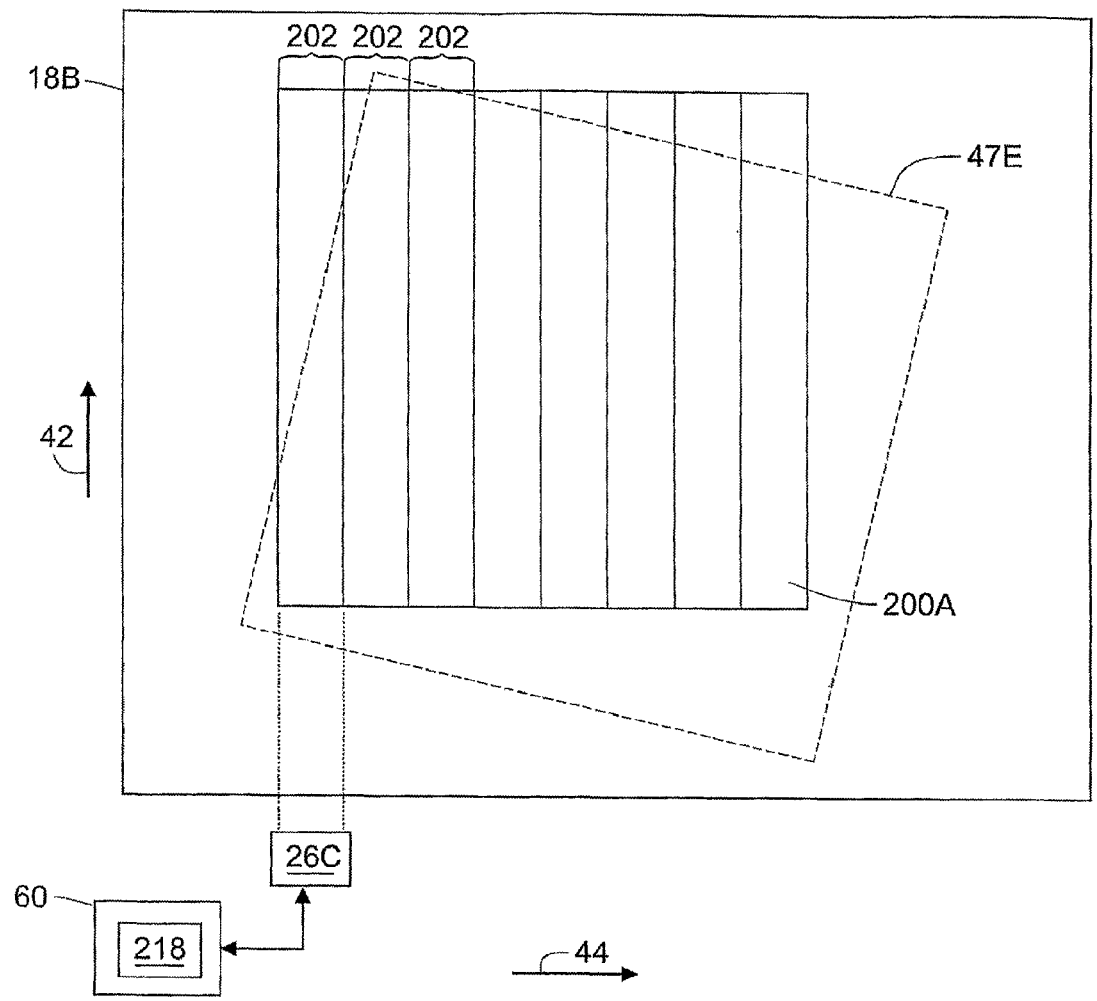
FIG. 9B is a schematic representation of a conventional imaging of the receiver element of FIG. 9A.

FIG. 9B shows a conventional imaging of receiver element 18B. In this case imaging head 26C images receiver element 18B by generating a plurality of image swaths 202. Image information data 218 representing image 200 is provided by controller 60 to imaging head 26C. Each swath is formed during a scan of imaging head 26C. In this case each swath 202 is formed by scanning receiver element 18B along a path aligned with main-scan direction 42, while maintaining imaging head 26C at a fixed sub-scan position. A movement of imaging head 26C along a path aligned with sub-scan direction 44 is made between successively imaged swaths 202. During each scan a portion of an image corresponding to an imaged swath 202 is formed on receiver element 18B. This imaging method however results in the formation of image 200A that is not in register with registration region 47E; a result which can diminish the visual quality of the imaged receiver element 18B.

Figure 9C:
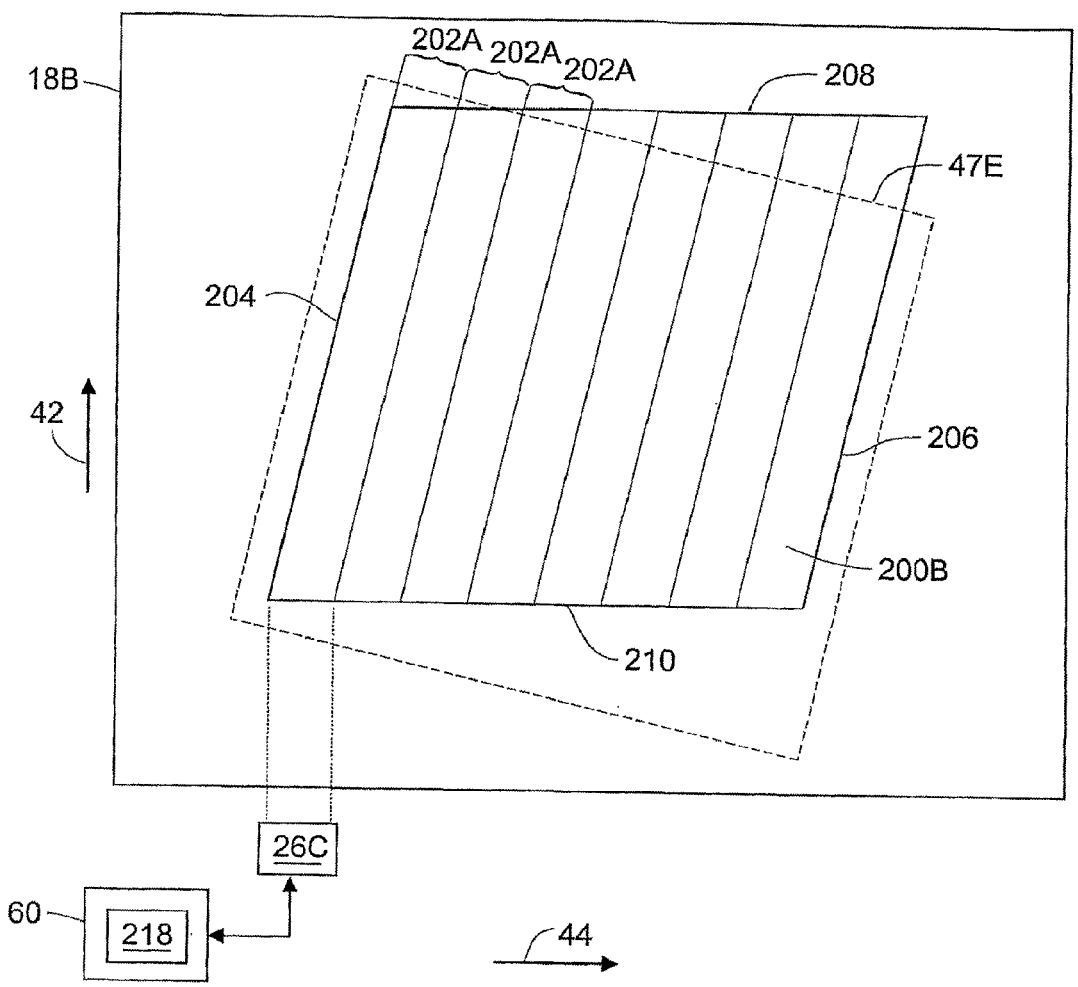
FIG. 9C is a schematic representation of a step used to form an image on the receiver element of FIG. 9A as per an example embodiment of the invention.
Figure 9D:
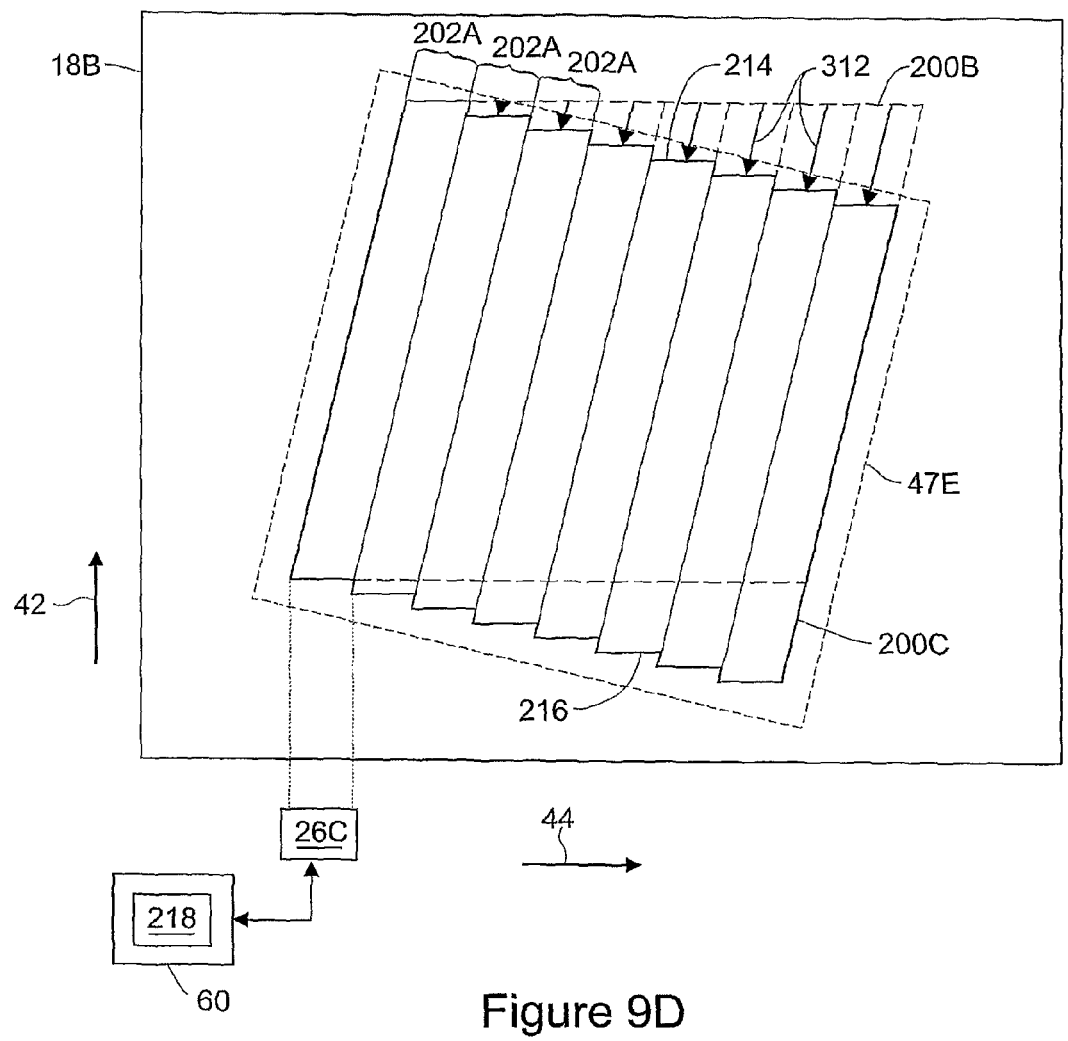
FIG. 9D is a schematic representation of a step used to form an image on the receiver element of FIG. 9A as per an example embodiment of the invention.

FIGS. 9C to 9D show a sequence of steps as per an example embodiment of the invention used to form an image in substantial registration with registration region 47E. Referring to FIG. 9C, imaging head 26C and receiver element 18B are moved in a synchronous fashion during each scan. In this example embodiment of the invention, sub-scan motion is coordinated with main-scan motion in accordance with the previously aforementioned correction maps. Controller 60 uses the correction maps to achieve this coordinated motion by controlling motion system 59 (not shown) such that the sub-scan axis servo's target position is directly tied in real time to the correction map. As main-scan motion is established, the required synchronous sub-scan motion is defined by the correction maps and oriented swaths 202A. Employing coordinated motion during the scans results in the formation of image 200B. Image 200B is formed with edges 204 and 206 that are in register with portions of registration region 47E. Coordinated motion can be used to form edges 204 and 206 that are continuous and smooth, which can facilitate an accurate registration of portion of a formed image with a portion of a registration region.

FIG. 9C shows that while coordinated motion has resulted in the formation of image 200B with edges 204 and 206, edges 208 and 210 of image 200B are still not in register with registration region 47E. FIG. 9D shows a step in which the activation timing for various channels in imaging head 26C are altered to produce an imaged region 200C that is in register with registration region 47E and that is substantially close in characteristics desired image 200. A channel is activated to emit or not emit imaging beams on the basis of image data. However, the actual time in which a channel can be activated to emit or not emit imaging beams can be advanced or delayed by adjusting the activation timing of the channel. Varying activation timing can be used to vary the position of a plurality of imaged areas with respect to one another. Varying activation timing can be used to vary the position of imaged and non-imaged areas with respect to one another.

Image 200B (shown in broken lines) is shown in FIG. 9D as a reference for the activation timing changes. In this example embodiment of the invention, the activation timing (schematically represented by arrows 312) is varied, thus forming image 200C with edges 214 and 216 that are substantially in register with registration region 47E. Edges 214 and 216 are saw-tooth in nature but are aligned with corresponding portions of registration region 47E. In some example embodiments of the invention, the step sizes in the saw-tooth edge profiles are related to the amount of activation timing delay associated with the imaging of corresponding areas. In other example embodiments of the invention, the imaging channel activation timing can be advanced. Controller 60 and imaging electronics 84 (not shown in FIG. 9) alter that activation timing of various imaging channels in accordance with the calibration maps. The activation timing of all or a portion of the imaging channels used during the imaging of each swath can be altered. In this example embodiment of the invention, all of the channels employed to image each swath are given a uniform delay from swath to swath.

Figure 9E:
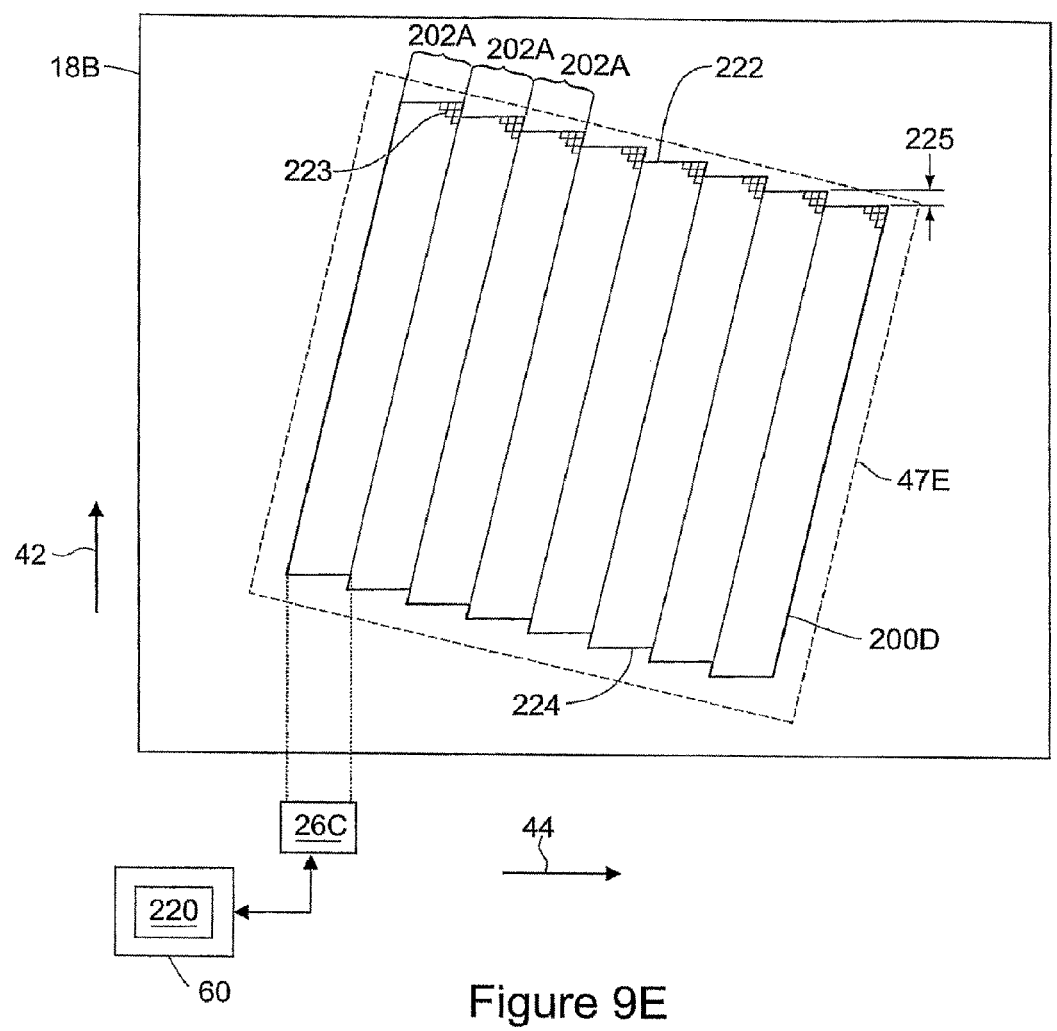
FIG. 9E is a schematic representation of a step used to form an image on the receiver element of FIG. 9A as per an example embodiment of the invention.

In other example embodiments of the invention, the image information data is modified to produce and imaged region that is in register with registration region 47E and that is substantially close in characteristics to desired image 200. As schematically shown in FIG. 9E, image information data 218 is modified in a process called "image shearing" to produce a sheared image data 220. Sheared image data 220 includes a modified raster file in which when imaged by imaged imaging head 26C forms an image 200D with edges 222 and 224 that are substantially in register with registration region 47E. Edges 222 and 224 are saw-tooth in nature. Unlike embodiments of the invention in which the activation timing changes dictate the rise heights of each saw-tooth, the rise 225 of each of saw-tooth steps in this embodiment are related to the size of the pixel 223 imaged by imaging head 26C in response to the modified data file.

FIGS. 9C and 9D show steps that employ coordinated motions and channel activation timing changes to form an image in substantial registration with a registration region. FIGS. 9B and 9E show steps that employ coordinated motion and sheared images to form an image in substantial registration with a registration region. Referring back to FIG. 4, a plurality of registration regions 47 are shown, several of which have a different orientation from one another. In this example embodiment of the invention, each registration region 47 is represented in the sub-scan and main-scan correction maps corresponding to the imaging heads 26 that are to image these respective registration regions. The determined orientation and placement coordinates of each set of registration marks 21 in combination with the nominal registration region coordinates as defined in registration information 62 in turn defines the rotation, scale and shift for that particular registration region 47.

In an example embodiment of the invention corresponding to FIG. 4, different coordinated motions and imaging channel activation sequences are employed for each of the imaging heads 26 to form images in substantial registration with corresponding registration regions 47. For example, since registration region 47A is skewed by angle $\theta_1$ and registration region 47B is skewed by a different angle $\theta_2$, imaging head 26A will form an image in registration with registration region 47A with a different set of coordinated motion parameters and channel timing activations than the set employed by imaging head 26B during the formation of an image in registration with registration region 47B. In this example embodiment of the invention, each imaging head 26A and 26B can have a different speed along the sub-scan direction while each imaging head is imaging. In other example embodiments of the invention, different multi-channel imaging heads can have different speeds along the main-scan direction while each head is imaging. In other example embodiments of the invention, different multi-channel imaging heads can have different speeds along the main-scan and sub-scan directions while each imaging head is imaging.

In an example embodiment of the invention, the activation timing of various channels in each imaging head 26A and 26B will be occur at different times while each imaging head is imaging. In other example embodiments of the invention, the activation timing of different numbers of channels is different for each imaging head 26A and 26B. In other example embodiments of the invention, the activation timing of different groups of channels is different for each imaging head 26A and 26B. In other example embodiments of the invention, the activation timing of various channels in imaging head 26A can be delayed while the activation timing of various channels in imaging head 26B can be advanced.

Referring back to FIG. 4, imaging head 26A is also required to form an image in register with registration region 47C while also scanning over registration region 47A. In this example embodiment of the invention, registration region 47C does not assume a skewed orientation but is shifted in the sub-scan direction 44 by distance $\Delta_1$. Although imaging head 26A need not undergo coordinated motion to form an image in register with registration region 47C, imaging head 26A can undergo coordinated motion in the region between registration regions 47A and 47C. The use of coordinated motion between successively formed images can allow an imaging head to be properly positioned during the imaging of the successive image. In other example embodiments of the invention, a plurality of images is formed during a scan of a multi-channel imaging head over a receiver element. Each of the images are aligned differently from one another and the imaging head employs different coordinated motions and imaging channel activation sequences while imaging each image along the scan path. In other example embodiments of the invention, a plurality of images is formed in registration with a corresponding plurality of registration regions during a scan of a multi-channel imaging head over a receiver element. Each of the registration regions are aligned differently from one another and the imaging head employs different coordinated motions and imaging channel activation sequences while imaging each image in registration with its corresponding registration region.

When independent coordinated motions and imaging channel activation sequences are employed by each imaging head of an imaging system that comprises a plurality of imaging heads, each imaging head can be used to form corresponding images that are aligned differently from one another. These corresponding images can be formed on one or more receiver elements. When different coordinated motions and imaging channel timing sequences are employed by each imaging head of an imaging system that comprises a plurality of imaging heads, each imaging head can be used to form corresponding images that are substantially registered with registration regions that have different orientations to one another. Multi-imaging head systems that employ independent coordinated motions and imaging channel activation sequences can advantageously increase productivity.

In some example embodiments of the invention, the activation timing for various channels in a multi-channel imaging head are altered to align various portions of an image with corresponding portions of a registration region. One method of varying the activation timing involves adjusting the activation timing of imaging channels used to image the features on a swath by swath basis. That is, a single uniform adjustment is made to the activation timing of all the active imaging channels employed in any given swath. In other swaths, another single uniform adjustment is made to the activation timing of all of the active imaging channels employed in each of those swaths. In this manner, this form of skew correction typically results in a saw-tooth correction in which the correction are made in terms of integer number of swaths.

In an another example embodiment of the invention corresponding to FIG. 4, different coordinated motions and sheared image data 220 are employed for each of the imaging heads 26 to form images in substantial registration with corresponding registration regions 47. Since registration region 47A is skewed by angle $\theta_1$ and registration region 47B is skewed by a different angle $\theta_2$, imaging head 26A will form an image in registration with registration region 47A with a different set of coordinated motion parameters and sheared image data than the set employed by imaging head 26B during the formation of an image in registration with registration region 4713. In this example embodiment of the invention, each imaging head 26A and 26B has a different speed along the sub-scan direction while each imaging head is imaging. In other example embodiments of the invention, different multi-channel imaging heads can have different speeds along the main-scan direction while each head is imaging. In other example embodiments of the invention, different multi-channel imaging heads can have different speeds along the main-scan and sub-scan directions while each imaging head is imaging.

For some demanding applications (e.g. laser-induced imaging of color filters), swath by swath activation timing adjustments or sheared image data may not result in the formation of a repeating pattern of features that is in substantial alignment with a repeating pattern of registration sub-regions. In applications like color filters, the visual quality of the final product is dependant upon the accuracy with which a repeating pattern of features (e.g. the pattern of color filter elements) is registered with a repeating pattern of registration sub-regions (e.g. matrix). As the feature sizes are reduced this becomes increasingly difficult to do especially when repeating patterns of features are formed. Registration further become complicated when repeating patterns of island features are imaged since registration along both the sub-scan direction 44 and main-scan direction 42 is typically required. Registration can also be adversely impacted as the image swaths increase in size as the number of imaging channels in multi-channel imaging head is increased to improve productivity throughput.

Figure 10A:
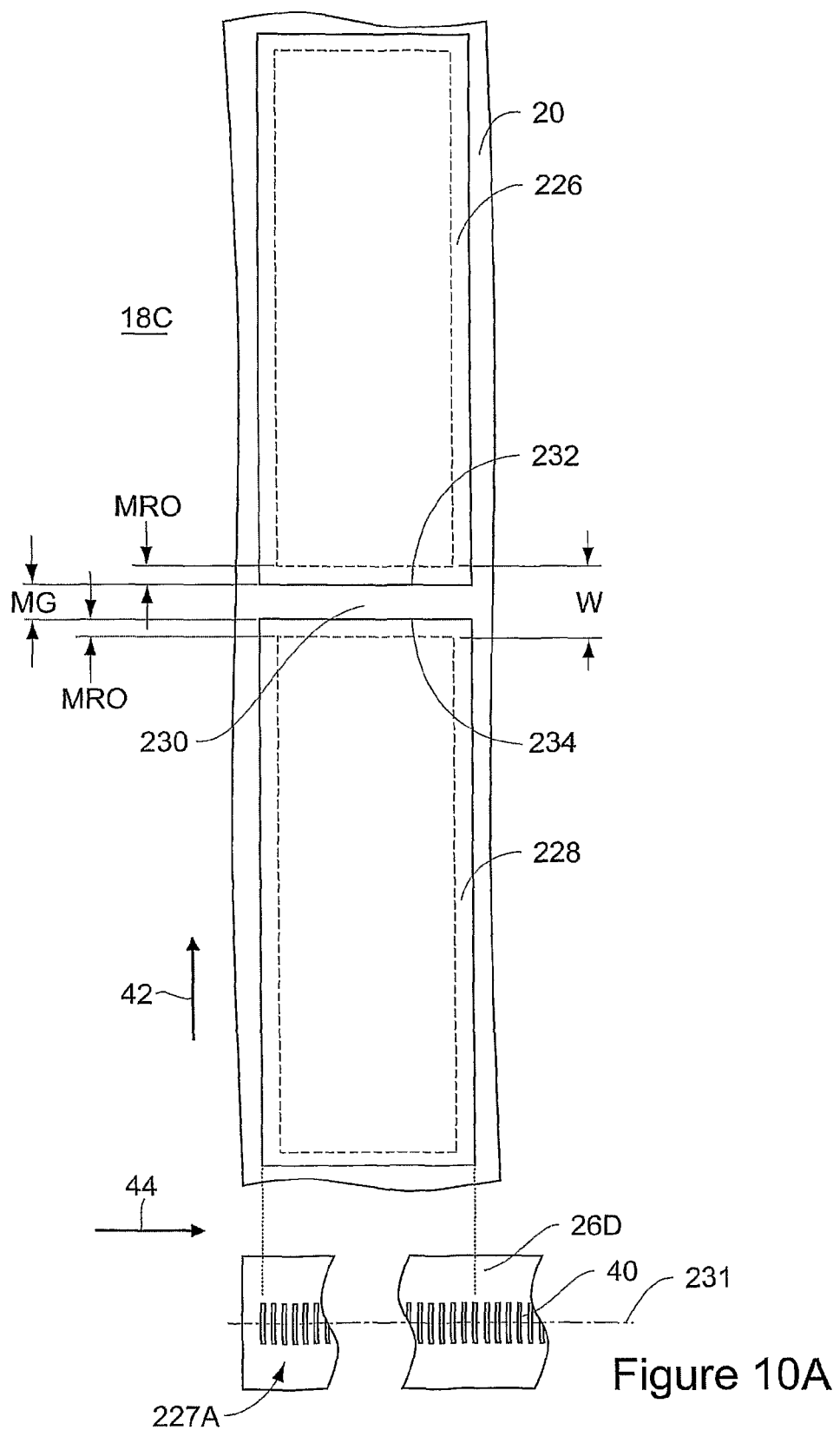
FIG. 10A is a representation of an orientation between two color features and a matrix portion.

FIG. 10A shows an orientation between two color features 226 and 228 and a matrix portion 230. Each of the color features 226 and 228 are island features which are to be imaged by imaging head 26D such that they are registered with matrix 20. Imaging head 26D includes and array 227A of individually addressable channels 40. Imaging head 26D can include one dimensional or two dimensional arrays 227A of channels 40. In this illustrated case, imaging head 26D includes a one dimensional array 227A whose axis 231 is aligned with sub-scan direction 44. Imaging head 26D images each of the color features during a scan over receiver element 18C. It is to be understood color features 226 and 228 can be concurrently imaged during a given scan or separately imaged in separate scans. In this case it is required that color features 226 and 228 overlap matrix 230 without overlapping each other. In this example embodiment of the invention, each of color features 226 and 228 are imaged by a plurality of imaging channels 40. In this example embodiment of the invention, each of color features 226 and 228 are imaged by a plurality of contiguous imaging channels 40.

Various factors must be considered when imaging color features 226 and 228 such that they align matrix portion 230 without overlapping each other. For example, each of the color features 226 and 228 must be imaged such that they overlap matrix portion 230 by a certain amount to achieve a desired quality characteristic of the color filter. A minimum required overlap for imaging each of the color features 226 and 228 can be estimated from the following equation:

$$\text{Minimum Required Overlap (MRO)} = \text{Plotter Accuracy} + \text{Matrix Repeatability} + \text{Absolute Minimum Overlap}, \quad (1)$$

where:

Plotter Accuracy represents the accuracy of the imaging system used to image color features 226 and 228. This accuracy can be affected by the mechanical repeatability associated with the positioning of imaging head 26D during the image, the beam finder accuracy, imaging beam drift; and the roughness of the edges of the images that are formed. A typical value for Plotter Accuracy can be in the range of +/−2.5 microns.

Matrix Repeatability represents the variation in the location of the matrix portion with respect to receiver element 18. A typical value for Matrix Repeatability is +/−0.5 microns.

Absolute Minimum Overlap represents the absolute minimum overlap that a color feature is required to have to achieve a desired quality characteristic. A typical value for Absolute Minimum Overlap is 1 micron.

A Minimum Required Overlap (MRO) based on the above typical values can be estimated to be approximately 4 microns.

Other factors can include the minimum gap requirement between the two color features 226 and 228 so that they do not overlap each other. The minimum gap requirement can be affected by the imaging repeatability especially when each of the color features 226 and 228 are imaged during separate scans. A minimum gap requirement can be estimated by the following equation:

$$\text{Minimum Gap (MG)} = 2 \times \text{Imaging Repeatability}, \quad (2)$$

where:

Imaging Repeatability represents the repeatability of positioning color elements 226 and 228 in their intended positions. Imaging Repeatability can be affected by the mechanical repeatability associated with the positioning of imaging head 26D during the imaging, beam drift and the roughness of the edges of the images that are formed. A typical value for Imaging Repeatability is +/−2.5 microns to provide a Minimum Gap (MG) of 5 microns.

Other factors can include the addressability of imaging head 26D. The ability to control the size of each of the imaged color features 226 and 228 is a function of the pixel size. For example, changing a size of each of the color features 226 and 228 by one pixel effectively means that the position of an edge of each feature changes by one half pixel with respect to corresponding edge of matrix portion 230. A half pixel of margin between the Minimum Gap (MG) and the Minimum Required Overlap (MRO) is required to ensure that both these requirements can be met. An addressability requirement can be estimated from the following equation:

$$\text{Addressability} = \text{Matrix Line Width} - 2 \times \text{Minimum Required Overlap (MRO)} - \text{Minimum Gap (MG)}, \quad (3)$$

where:

Addressability refers to a pixel size characteristic as imaged by the imaging head 26D. In this particular case, addressability refers to a pixel size characteristic in a main-scan direction (i.e. main-scan addressability). Main-scan addressability can be varied by adjusting the exposure timing of imaging channels 40 as they direct imaging beams. Varying the length of time that a given imaging beam interacts with a media changes a rate in which the media is exposed which results in a change in the size of the pixel along a scanning direction. In this case, the exposure timing of channels 40 can be adjusted relative to the main-scan encoder associated with motion system 59. A digitally synthesized phase lock loop can be used to control the imaging timing using the main-scan encoder. Adjusting parameters in the loop can give precise control of the main-scan addressability and be used to vary a size of the imaged pixels along a scan direction. In various example embodiments of the invention, the size of the pixels along a scan direction is adjusted for various reasons. For example, it is preferred to image an integer number of pixels along a scan direction in each cell 34 of the matrix 20 to ensure a consistent positioning of colorant in each cell. Any systematic change in position could create image artifacts such as banding. The size of the pixels can be adjusted to form a pattern of features in substantially alignment with a pattern of registration sub-region. It is preferred that the various features be sized appropriately along the scan direction to each evenly overlap matrix portions 230 to facilitate the MRO and MG requirements. It is preferred that the various features be sized appropriately along the scan direction such that the pitch of the pattern of features matches the pitch of matrix cells 34 along the scan direction. In various example embodiments of the invention, the size of pixels along the scan direction is varied by varying the main-scan resolution. In applications such as color filters, a main-scan addressability of approximately 5 microns or smaller is desirable. In some example embodiments of the invention, main-scan addressabilities are adjusted in accordance with a pattern of registration sub-regions. In some example embodiments of the invention, main-scan addressabilities are adjusted to have non-integer values.

Matrix Line Width is size characteristic of matrix portion 230. In this example this is corresponds to a size W of matrix portion 230.

One may arrange equations (1), (2) and (3) and estimate a minimum matrix line width as follows:

$$\text{Matrix Line Width (W)} = \text{Addressability} + 2 \times \text{Minimum Overlap} + \text{Minimum Gap}. \quad (4)$$

By using the typical values discussed above, a minimum Matrix Line Width (W) can be estimated to be 18 microns (i.e. 5 microns+(2×4 microns)+5 microns). Some conventional color filters have matrix line widths in the order of 20 to 24 microns. It is desired to produce color filters with matrix line width that are smaller than these conventional values.

FIG. 10A shows a desired case in which imaging head 26D is positioned with respect to matrix 20 such that color features 226 and 228 are imaged with edges 232 and 234 that are aligned with axis 231 of channel array of 227A. Edges 232 and 234 do not overlap each other and are formed in registration with matrix portion 230.

Figure 10B:
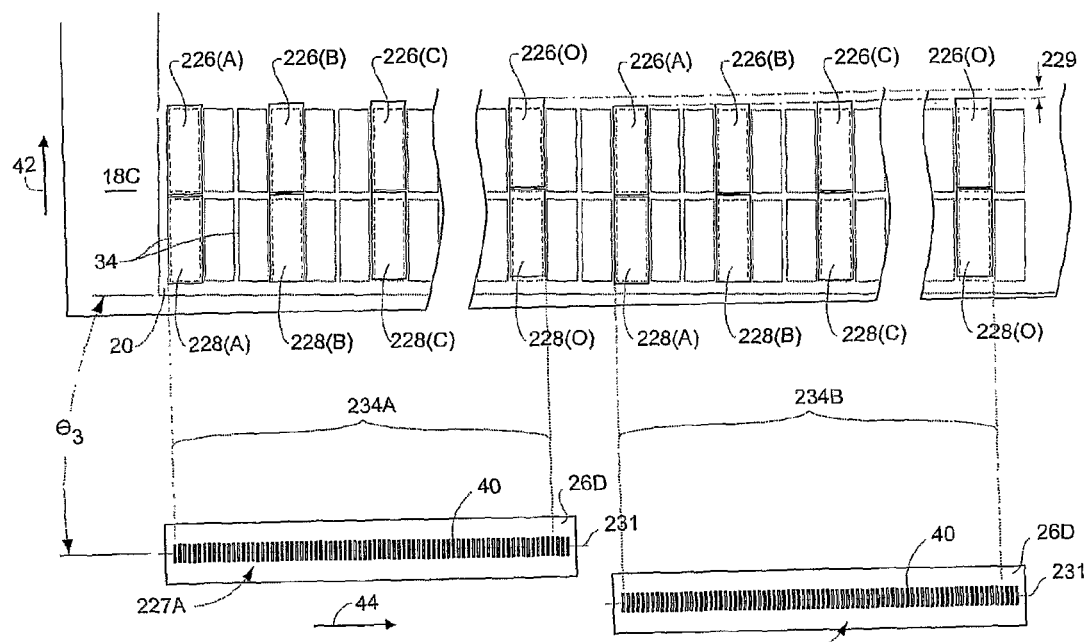
FIG. 10B is a schematic view of an imaging of a pattern of the color features of FIG. 10A.

FIG. 10B shows a case in which matrix 20 is rotated by an angle $\theta_3$ with respect to axis 231 of channel array 227A of imaging head 26D. Color features such as color features 226 form part of a pattern that is to be formed in with matrix 20. In this case, the plurality of color features 226 and color features 228 is imaged using coordinated motion techniques during each scan of imaging head 27D. An imaged swath 234A is produced during a first scan and an image swath 234B is produced during a second scan. In this case, each swath is imaged by an array of approximately 900 imaging channels (exact number not shown), with an addressability of 5 microns to produce a swath that is approximately 4.5 mm wide. Each of the color features 226 and 228 is imaged by 20 imaging channels and is regularly arranged in a pattern such that rows of fifteen color features 226 (shown as color features 226(A) through 226(O) are formed during each scan. Color features 228 are arranged and imaged in a similar fashion (shown as color features 228(A) through 228(O)). Color features 228 comprise different colors than color features 226 and are typically imaged in different scans than color features 226. For the sake of clarity, not all of the color features 226(A) to 226(O) and 228(A) to 228(O) and the matrix cells 34 are shown. In this case, each of the color features 226 and 228 repeat with a pitch corresponding to three cells 34.

In this case, matrix 20 is rotated with respect to imaging head 26D by angle $\theta_3$ that is 1 milli-radian corresponding to a typical positional variation of receiver element 18C within the imaging system (FIGS. 10B, 10C, 10D and 10E show exaggerated angles $\theta_3$ for the sake of clarity). To compensate for this rotational error, the activation timing of all the channels 40 used to produce each swath 234B is varied with respect to the formation of swath 234A. An offset 229 equal to 4.5 microns is formed between the two imaged swaths 234A and 234B to compensate for the 1 milli-radian rotation. Even such apparently minor offsets can however lead to numerous problems. For example, while the registration between matrix 20 and the imaged color features 226(A) and 228(A) is not significantly affected by the swath-to-swath activation timing changes, the registration between matrix 20 and color features such color features 226(O) and 228(O) can be affected by the resulting offset.

Figure 10C:
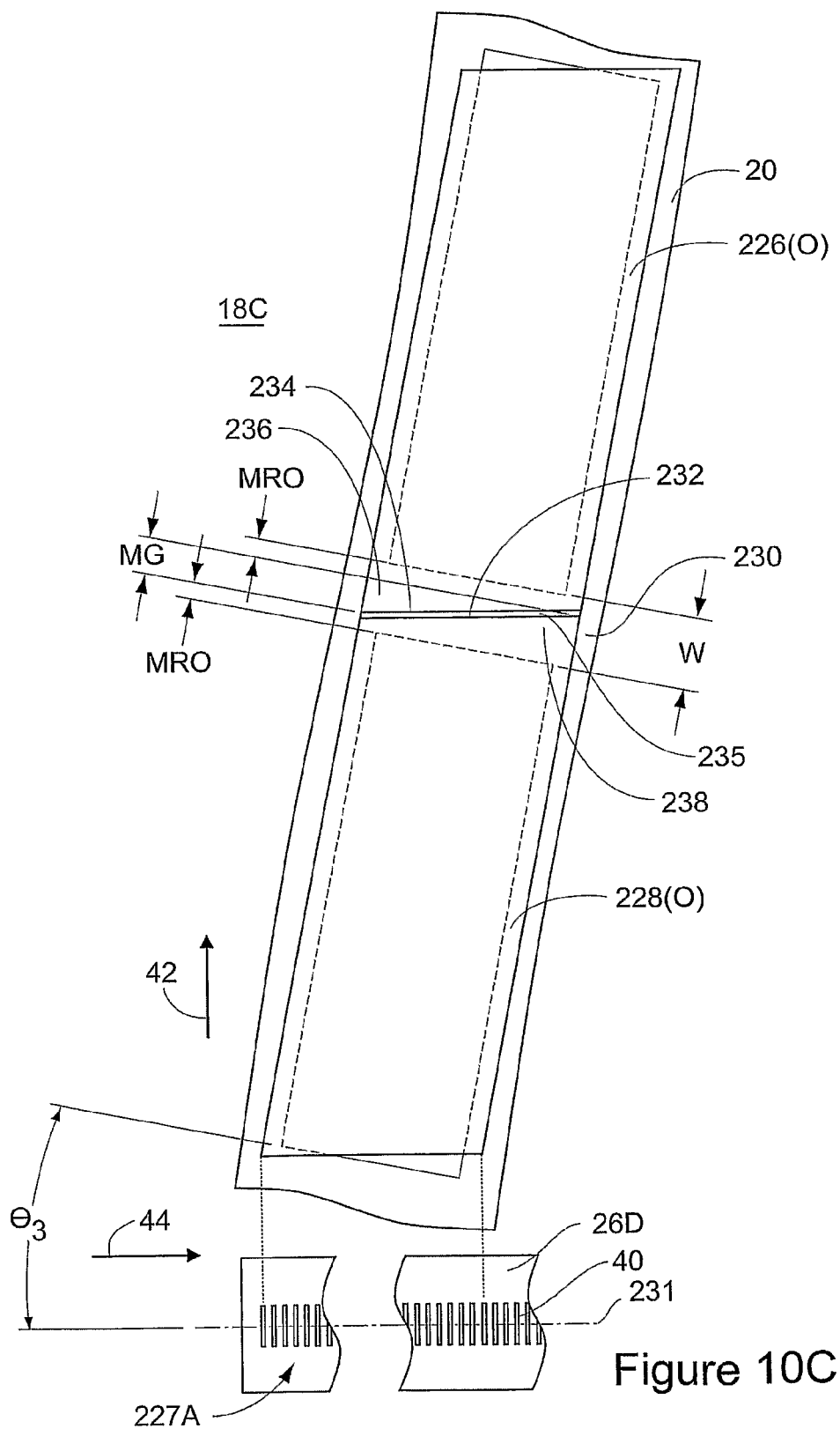
FIG. 10C is representation of a possible registration affect of several color features of FIG. 10B.
Figure 10D:
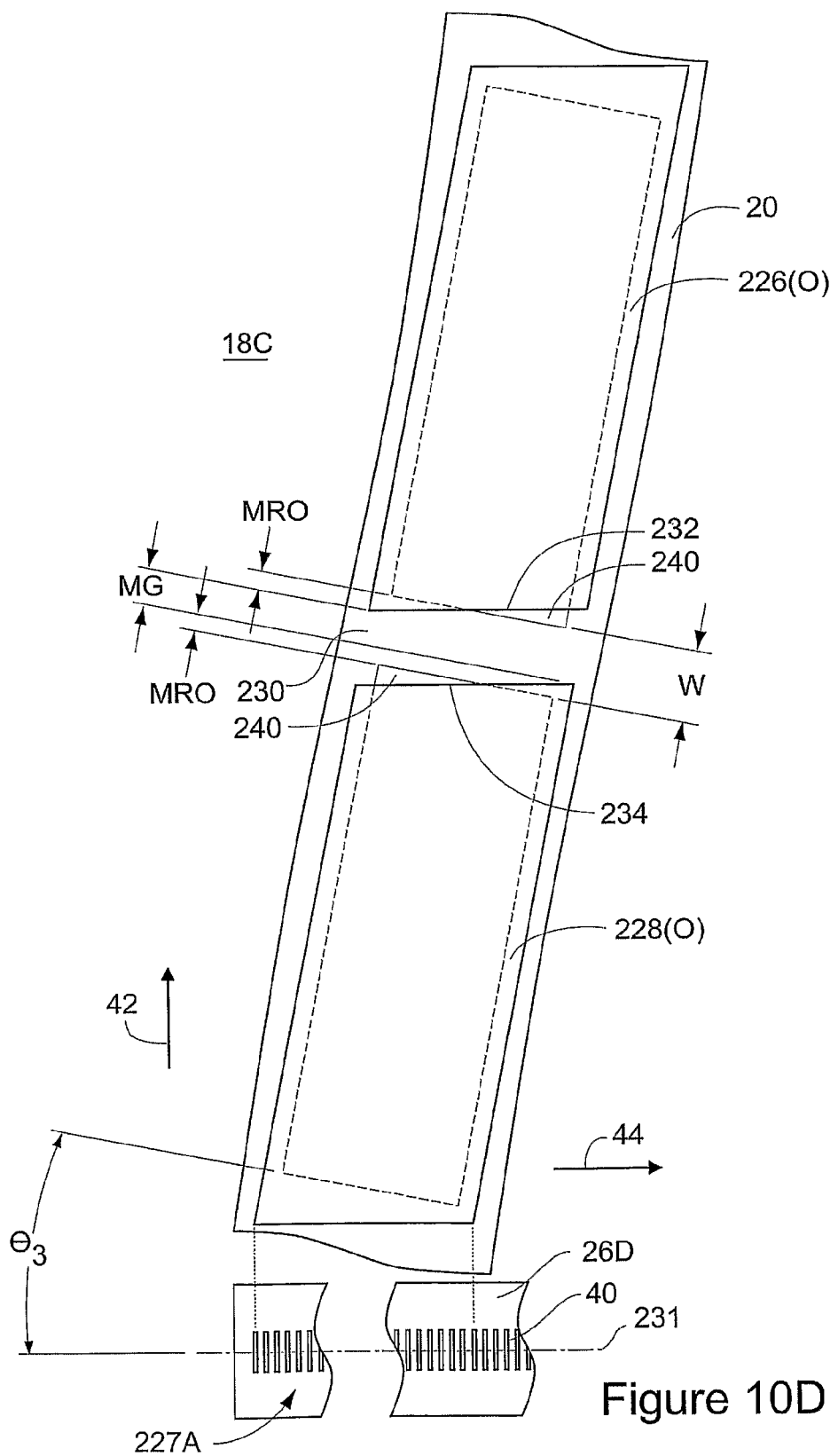
FIG. 10D is representation of a possible registration affect of several color features of FIG. 10B.

FIGS. 10C and 10D schematically show possible registration affects associated with features such as color features 226(O) and 228(O). In FIG. 10C, case, the swath-to-swath activation timing has been delayed such that the Minimum Required Overlap is still substantially maintained in each of color features 226(O) and 228(O). However, unlike color features 226(A) and 228(A), swath-to-swath activation timing changes have caused imaged features 226(O) and 228(O) to be displaced by an amount substantially equal to the entire offset of 4.5 microns. Portions 236 and 238 of the color features 226(O) and 228(O) impinge in the Minimum Gap region and increased the chances that they will overlap one another in an undesired condition (color features 226(O) and 228(O) are shown overlapping one another in region 235). In this case, the width W of matrix portion 230 was 18 microns; the Minimum Gap between the features was 5 microns, and the Minimum Required Overlap was 4 microns. Again it is to be understood that angle $\theta_3$ has been exaggerated for the sake of clarity and may not be identical to that shown in FIG. 10B.

One may try to avoid impinging in the Minimum Gap area by delaying the activation timing of channels 40 such that the Minimum Gap is maintained as shown in FIG. 10D. This however portions 236 and 238 to impinge in the Minimum Required Overlap region and increases the chances that un-imaged areas 240 can result between the matrix portion 230 and the imaged color features. Again it is to be understood that angle $\theta_3$ has been exaggerated for the sake of clarity and that in actuality, portions 236 and 238 would comprise more of a rectangular shape than the illustrated wedge shape shown in FIGS. 10C and 10D. Clearly, as increased throughput requirements demand imaging heads with even greater numbers of imaging channels, misregistration between various color features and the matrix can increase as the swath widths increase.

Figure 10E:
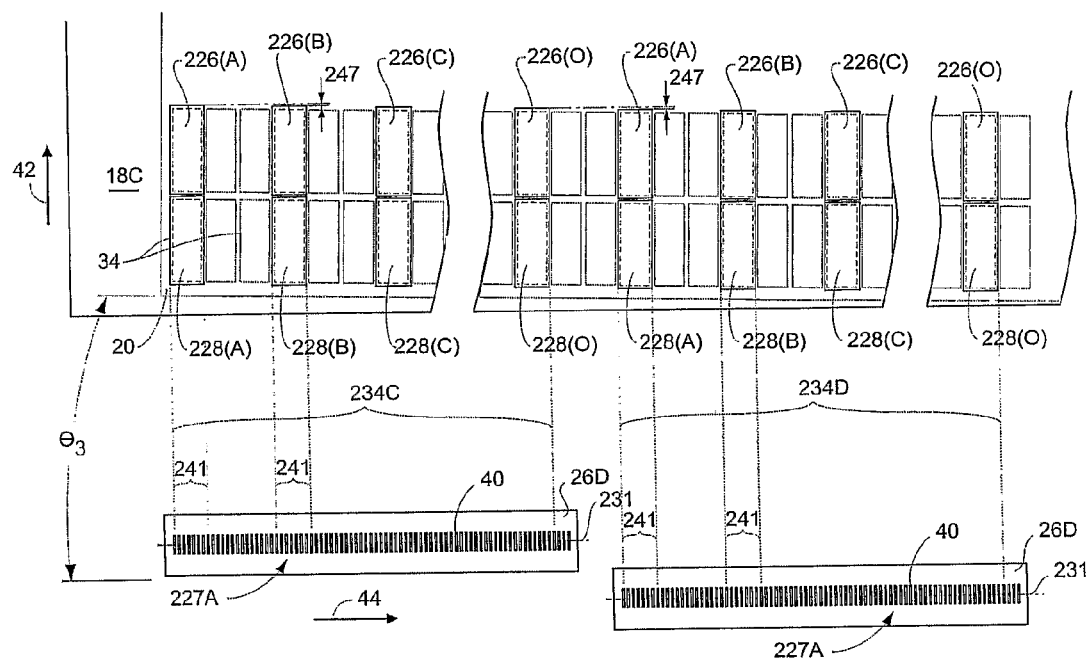
FIG. 10E is a schematic view of an imaging of a pattern of the color features of FIG. 10A as per an example embodiment of the invention.

FIG. 10E shows the imaging of patterns of features 226 and 228 on receiver element 18C of FIG. 10B but imaged as per an example embodiment of the invention. Matrix 20 is again rotated by an angle $\theta_3$ with respect to imaging head 26D. In this embodiment, matrix 20 is rotated by angle $\theta_3$ with respect to axis 231 of the channel array 227A. In this example embodiment of the invention, portions of each color features 226 and 228 are imaged using coordinated motion techniques during each scan of imaging head 26D. In other example, embodiment of the invention, portions of color features 226 and 228 can be imaged by other techniques. An imaged swath 234C is produced during a first scan and an image swath 234D is produced during a second scan. Each color feature 226 and 228 is imaged by 20 imaging channels 40. Each of the color features 226 and 228 are regularly arranged in a pattern that includes several rows of fifteen color features 226 (shown as color features 226(A) through 226(O)) and several rows of color features 228 (shown as color features 228(A) through 228(O)). In this example embodiment of the invention, each pattern of color features 226 and 228 is imaged during a scan of imaging head 26E. Color features 228 comprise different colors than color features 226 and are typically imaged in different scans than color features 226. Again, not all of the color features 226(A) through 226(O) and color features 228(A) through 228(O) are shown for the sake of clarity.

Matrix 20 is rotated with respect to imaging head 26D by angle $\theta_3$ that is again 1 milli-radian ($\theta_3$ is exaggerated for the sake of clarity). To compensate for this rotational error and maintain a desired registration between the matrix 20 and each of the color features 226 and 228, the activation timing of various sub-groups 241 of channels in the array of channels is varied. In this example embodiment of the invention, channel sub-groups 241 each consist of 20 imaging channels. In other example embodiments of the invention, channels sub-groups 241 can consist of a different number of imaging channels 40. Since the 1 milli-radian rotation requires a total compensation of 4.5 microns across the entire swath, each channel sub-group 241 compensates for portion equivalent to the number of channels in the channel sub-group 241. In this example embodiment of the activation timing of each of the subgroups of channels is adjusted such that each of the corresponding portions of an imaged swath are offset from each other by an offset 247 equal to (20/900)×4.5 microns or 0.1 microns. The offsets 247 are aligned with a scan direction associated with the imaging. In this example embodiment of the invention, the scan direction is related to the coordinated motion techniques employed. In other example embodiments of the invention, the scan direction can be aligned with main-scan direction 42. Various channels within various channel sub-groups 241 are activated to form imaged areas. Various channels within various channel sub-groups are activated to form un-imaged areas. In this example embodiment of the invention, since each of the color features are imaged by channel sub-groups 241 during a given scan, the color features themselves will be offset from one another by an amount equal to multiples of 0.1 microns. In this manner, each of the color features 226(A) through 226(O) and color features 228(A) through 228(O) will each not be mis-registered with matrix 20 by more than 0.1 microns. This small offset amount will not impact the constraints imposed by the Minimum Required Overlap and Minimum Gap requirements previously defined even though matrix 20 is rotationally skewed with respect to imaging head 26D. Advantageously this facilitates the imaging of receiver elements that comprise matrixes with thinner lines.

Adjusting the activation timing of channel sub-groups 241 to produce offsets as low as 0.1 microns is readily achieved without compromising the productivity of the imaging system. For example, for scanning speeds of up to 2 meters per second, and a 0.1 micron offset would correspond to a activation timing delay of 50 nanoseconds, which is readily achievable by current activation electronics. Activation timing delays of 8 nanosecond resolution have been used by the present inventors. For some applications shearing image data in accordance with the overall degree of rotational skew may not provide the degree of registration required between the imaged color features and the matrix. Shearing image data produces a bit map file in which each bit corresponds to an imaged or un-imaged pixel. Accordingly, sheared image data can lead to imaged offsets based on the addressability of the imaging system. In the previous example, an individual channel addressability of 5 microns was used and a resulting offset based on this value would not provide the required registration between the matrix 20 and imaged color features 226 and 228. Adjusting the activation timing of various channels, allows for the formation of offsets that are smaller than a characteristic size of the image pixels.

A pattern of registration sub-regions includes various spatial arrangements of registration sub-regions. Adjacent registration sub-regions repeat in one or more directions within a pattern of registration sub-regions. As used hereinbelow, when something is described as being not parallel to a pattern of registration sub-regions, it refers to being not parallel to a line defined by a direction in which adjacent registration sub-regions repeat within the pattern of registration sub-regions. Adjacent registration sub-regions can repeat in one or more directions within the pattern of registration sub-regions. As herein described, being not parallel to a pattern of registration sub-regions can include being not parallel to a line in a direction in which adjacent registration sub-regions repeat along a row of the pattern of registration sub-regions. As herein described, being not parallel to a pattern of registration sub-regions can include being not parallel to a line in a direction in which the adjacent registration sub-regions repeat along a column of the pattern of registration sub-regions. In some example embodiments of the invention, the pattern of registration sub-regions is not parallel to an axis of a channel array (e.g. axis 231). In some example embodiments of the invention, the pattern of the registration sub-regions is not parallel to a scan direction of imaging beams directed by imaging head 26D onto receiver element 18C. In some example embodiments of the invention, relative motion is established between the imaging head 26D and receiver element 18D along a first direction that is not parallel to a pattern of registration sub-regions. In some example embodiments of the invention, a plurality of imaging channels 40 is activated to form an imaging line (e.g. imaging line 243 in FIG. 12) that is not parallel to a pattern of registration sub-regions.

In some example embodiments of the invention members of a plurality of features are imaged during separate scans of imaging head 26D by corresponding channel sub-groups. The plurality of features can be imaged in an interleaved fashion. For example, first and second features can be imaged during a first scan by activating channels within one or more channel sub-groups while a third feature is imaged between the first and second color features during a second scan by activating channels within an additional channel sub-group. The activation timing of at least one member of these channel sub-groups is different than the activation timing of another of another member of these channel sub-groups.

In some example embodiments of the invention, the activation timing of the various channel sub-groups is controlled independently of whether or not various channels within those channel sub-groups are activated to direct imaging beams. In some example embodiments of the invention, channel sub-groups are selected to correspond to one or more channels which are activated to direct imaging beams. In some example embodiments of the invention, a first channel sub-group is selected to correspond to one or more channels which are activated to direct imaging beams while a second channel sub-group is selected to correspond to one or more channels which are controlled not to direct imaging beams.

In some example embodiments of the invention, the activation timing is different for each member of a plurality of channel sub-groups, wherein at least one of the channel sub-groups is made up of a different number of channels than another member of the channel sub-groups. In some example embodiments of the invention a different number of channels in a first channel sub-group are activated to direct imaging beams than the number of channel that are activated to direct imaging beams in a second channel sub-group.

In some example embodiments if the invention, a first portion of a feature is imaged by activating various channels within a first channel sub-group while a second portion of the feature is imaged by activating a various channels within a second channel sub-group, the activation timing of the first channel sub-group being different than the activation timing of the second channel sub-group. In some example embodiments if the invention, the first portion and second portions of the feature correspond to first and second portions of an edge of the feature. The activation timing of the first and second channel sub-groups can be controlled to offset the first and second edge portions from one another. In applications such as the laser induced thermal transfer of color filter features, such offsets may not be readily visible due to the small magnitudes of the offsets between the edge portions and the image forming material transfer characteristics of the laser induced thermal transfer process. It is to be understood however that these edge portion are imaged in an offset manner.

The number of channels selected for each channel sub-group can be dependant on the imaging speed which is related to the switching resolution of the channel sub-groups. The number of channels selected for each channel sub-group can be dependant on the degree of rotation required between the imaged pattern of features and array of imaging channels. For example, various example embodiments of the invention employing channels sub-groups made up of a plurality of imaging channels can be used to image color filter features onto a matrix that is rotated on the order of 1 milli-radian with the array of imaging channels. As this rotation angle increase to larger magnitudes (e.g. 10 degrees) embodiments of the invention employing sub-groups made up of a single pixel would be more appropriate.

Figure 11A:
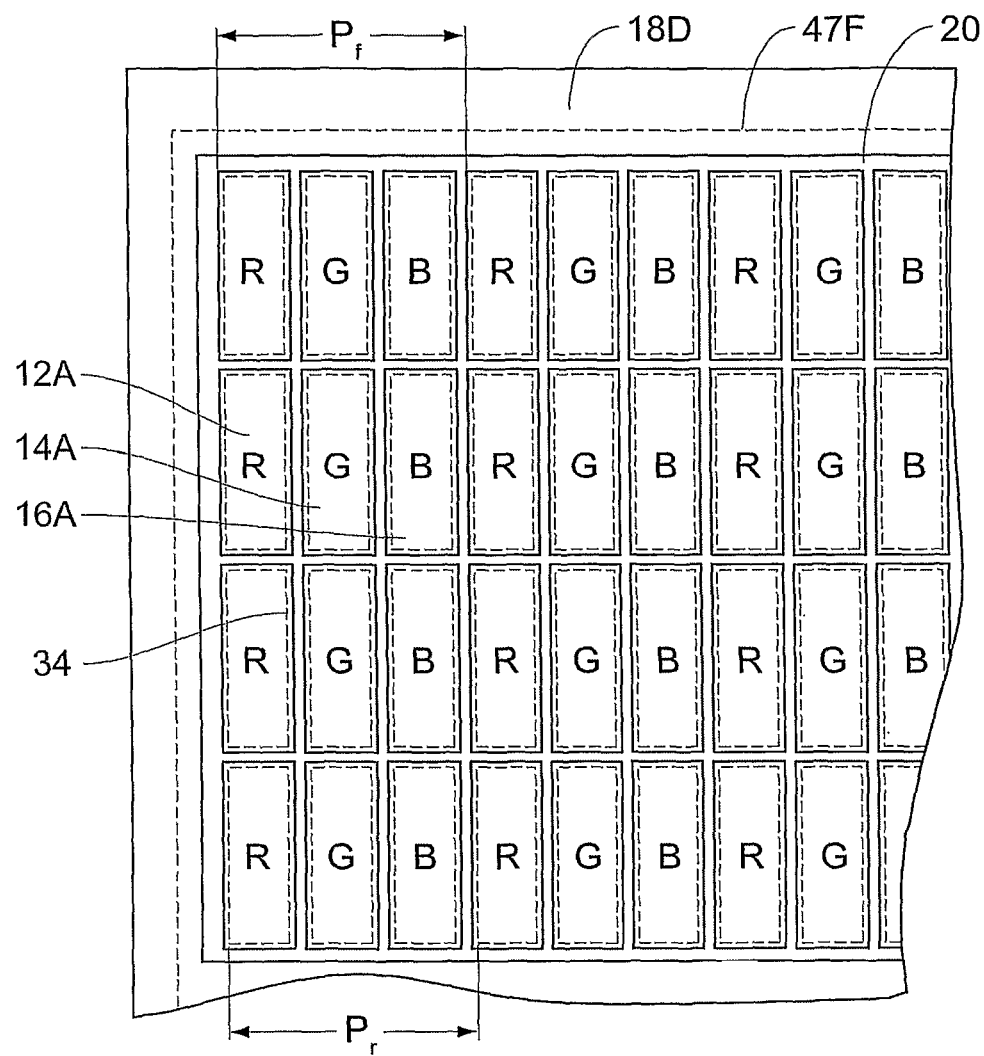
FIG. 11A is an example representation of a desired registration of a repeating pattern of features with a registration region.

Referring back to FIG. 5, step 340 involves a pitch and substrate rotation correction. A registration region represents a required bounds for the image that is formed with respect to that region. In some cases a registration region includes a repeating pattern of sub-regions (e.g. a matrix) with which an imaged repeating pattern of features must be registered. FIG. 11A shows an example of a desired registration of a repeating pattern of features with a registration region 47F made up of a repeating pattern of sub-regions. In this example, the registration region 47F includes a matrix 20 that is made up of a plurality of matrix cells 34. Various features are formed with respect matrix cells typically in a number of steps. In this case, it is desired that red features 12A, green features 14A and blue features 16A be formed on receiver element 18D. It is desired that each of the red features 12A, green features 14A and blue features 16A overlap portions of matrix 20 to avoid undesirable back lighting effects. Each of the red features 12A, green features 14A and blue features 16A are to overlap portions of matrix 20 without overlapping themselves. Accordingly, in this example, it is desired that the pitch "$P_f$" of each respective repeating pattern of red features 12A, green features 14A and blue features 16A equal substantially the pitch "$P_r$" of the repeating pattern of sub-regions (i.e. matrix cells 34).

Figure 11B:
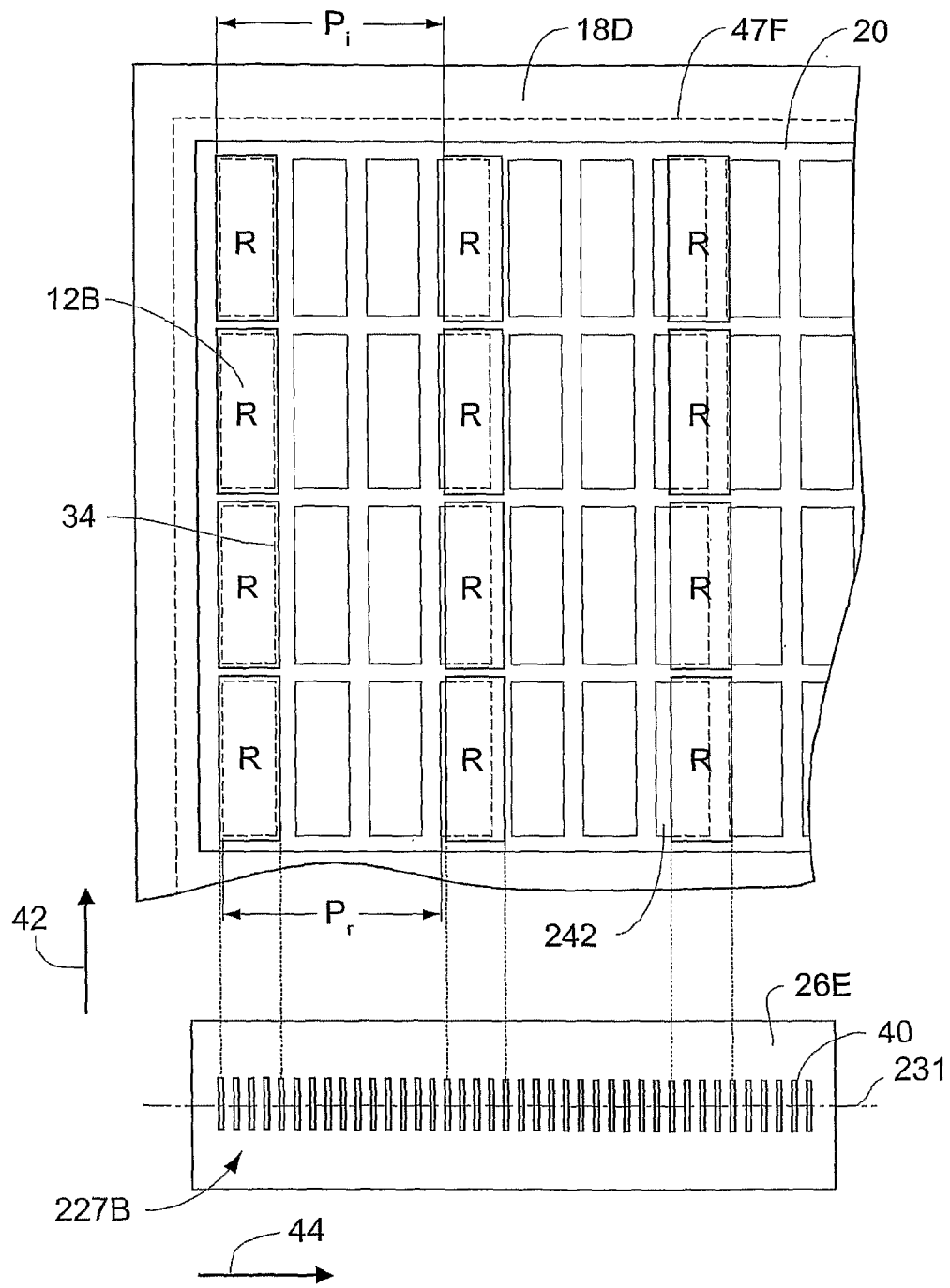
FIG. 11B is schematic view of a conventional imaging of the pattern of features of FIG. 11A.

FIG. 11B schematically shows the difficulties of imaging the receiver element 18D shown in FIG. 11A with conventional imaging techniques. FIG. 11B schematically shows a conventional imaging process that attempts to image desired red features 12A in register with corresponding matrix cells 34. The green features 14A and blue features 16A have been omitted for the sake of clarity. Imaging head 26E forms a repeating pattern of red features 12B that correspond to the desired pattern of red features 12A. Imaging head 26E is movable along a path aligned with sub-scan axis 44 and that includes an array 227B of individually addressable channels 40 capable of emitting imaging beams. Channel array 227B can include a one dimensional array or a two dimensional array. In this exemplary case, imaging head 26E assumes a typical orientation wherein an axis 231 of array 227B is substantially parallel to the pattern of matrix cells 34. As shown in FIG. 11B, the channel array 227B has an addressability that cannot image the repeating pattern of red features 12A with an initial pitch "$P_i$" that is equal to the pitch $P_r$ of the matrix cells 34 onto which the red features 12B are imaged onto. The ability to control the size and position of each of the imaged red features 12B is a function of the pixel size. Imaging beams generated by imaging head 26E each create a pixel of a size that cannot generated the desired pattern of the red features 12A. The imaged red features 12B overlap corresponding cells 34 by varying amounts. In this case, the amount of cell overlap of some of the red features 12B has increased to a point where those red features 12B would be overlapped by other features imaged with other donor elements which can result in various problems including the aforementioned problems. In some cases where a number of red features 12B are imaged in a given swath, some of these red features 12B may fail to overlap a matrix line altogether and create undesired un-imaged areas 242.

Figure 11C:
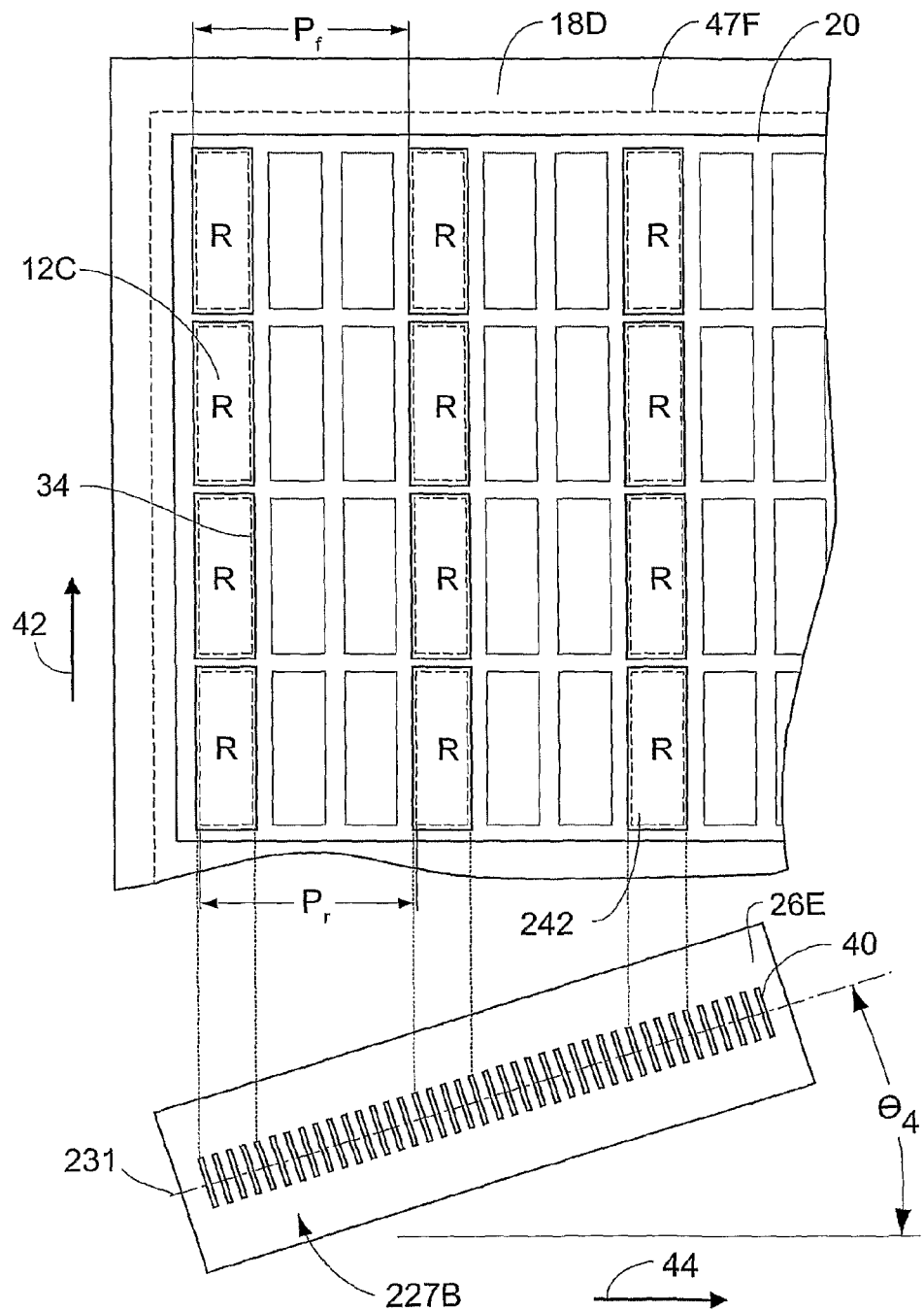
FIG. 11C is a schematic view of an imaging of the pattern of features of FIG. 11A as per an example embodiment of the invention.

FIG. 11C schematically shows an imaging of the receiver element 18D shown in FIG. 11A as per an example embodiment of the invention. FIG. 11C shows only an imaging process related to desired red features 12A. The green features 14A and blue features 16A have been omitted for the sake of clarity. Patterns of green features 14A and blue features 16A can be imaged as per this or other example embodiments of the invention. Red features 12C are imaged with the imaging head 26E which was used in the conventional imaging techniques shown in FIG. 11B. In this example embodiment of the invention, imaging head 26E is rotated with respect to matrix 20. In this embodiment, imaging head 26E is rotated by an angle $\theta_4$ as measured from the sub-scan direction 44 to the axis 231 of the array 227B. Angle $\theta_4$ is selected so that the imaging swath produced by rotated imaging head 26E is sized to produce imaging beams that cause the pattern of red features 12C to be imaged with a pitch $P_f$ that is equal to the pitch $P_r$ of the matrix cells 34. In this example embodiment of the invention, the pitch distance between each of the red features 12C is adjusted by the rotation of imaging head 26E to adjust the spacing between the imaged red features 12C. Rotation of the imaging head 26E also causes the size of the imaged pixels to change. In this example embodiment of the invention, the size of the pixels are changed in a direction generally perpendicular to an image swath formed by imaging head 26E. Changes in pixel size can be noted along sub-scan direction 42. Changes in pixel sizes can cause a size of the imaged red features 12C to vary slightly from the targeted size of red features 12A. Size deviations between each the imaged red features 12C and targeted red features 12A are affected by the inherent sub-scan addressability of the array of imaging channels 40. In this embodiment, to practice the invention, a sufficient number of channels is selected to image each of the features with a sufficient number of adjusted pixel sizes. In applications such as color filter imaging, each of the color features will typically be allowed to overlap the matrixes within a certain range that can accommodate these variations. Rotation of the array of imaging channels 40 by angle $\theta_4$ with respect to matrix 20 allows the pitch of the repeating pattern of red features 12C to match the pitch of the matrix cells 34 thus ensuring a consistent degree of overlap between all of the imaged red features 12C and the matrix 20. Embodiments of the invention can also be used to image repeating patterns of other features in similar fashions.

Although in the embodiment of the invention shown in FIG. 11C, imaging head 26E was rotated from a initial position that was parallel to sub-scan direction 44, in other example embodiments of the invention, imaging head 26E is rotated by an appropriate angle from initial positions that are not necessarily so.

Figure 12:
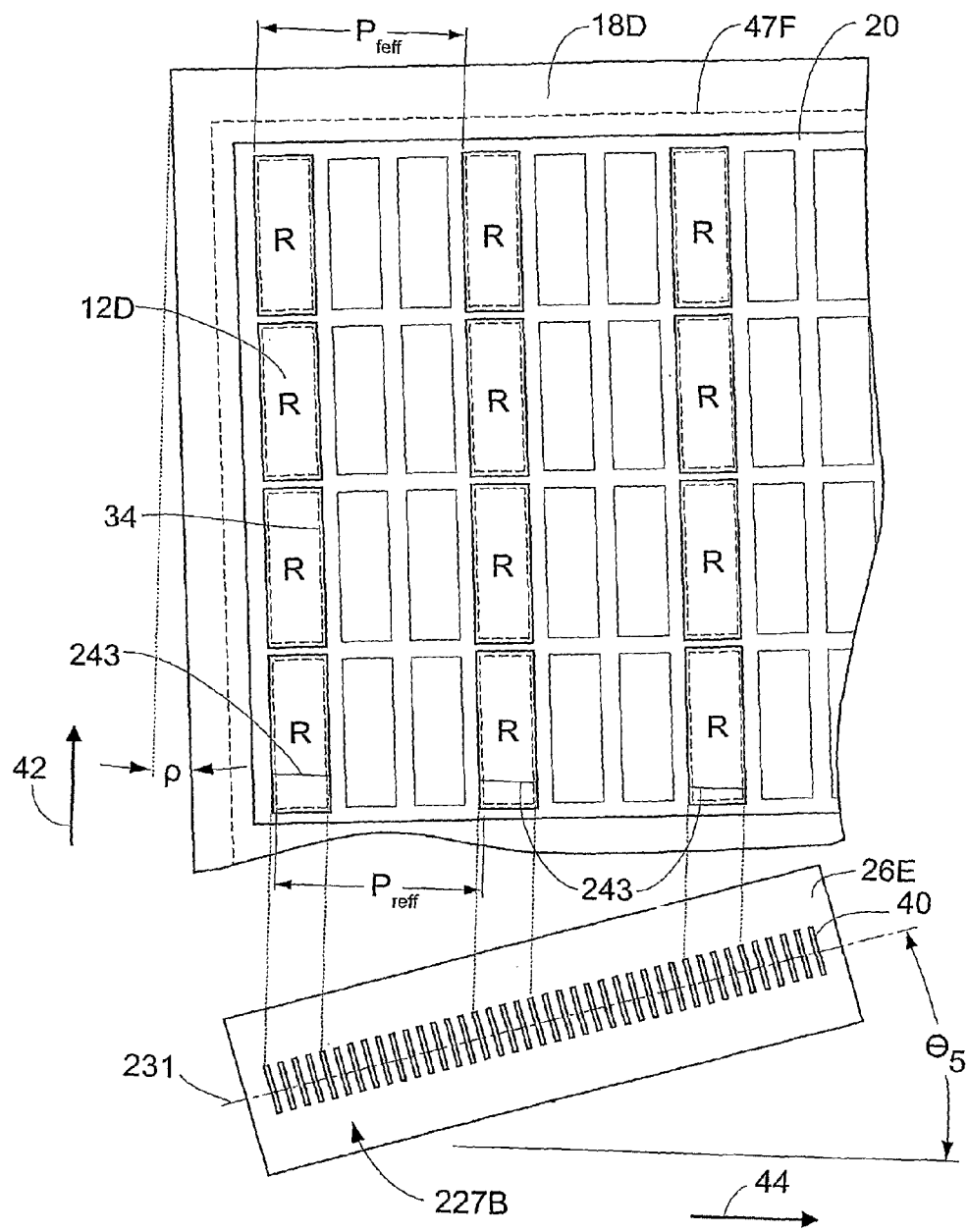
FIG. 12 is a schematic view of a skewed imaging of the pattern of features of FIG. 11A as per an example embodiment of the invention.

FIG. 12 schematically shows the imaging of the receiver element 18D as per an example embodiment of the invention. Receiver element 18D is identical to that shown in FIG. 11 with the exception that it is skewed by an angle ρ with respect to main-scan direction 42. FIG. 12 shows only an imaging process related to the imaging of red features 12A. Green features 14A and blue features 16A have been omitted for the sake of clarity. The array 227B of individually addressable channels 40 in imaging head 26E are activated to direct imaging beams to form a scanning imaging line 243 used to form red features 12D. In this example embodiment of the invention, imaging head 26E is movable along a path substantially parallel to sub-scan direction 44. Relative motion is established between imaging head 26E and receiver element 18B in a direction aligned with main-scan direction 42. The array 227B of imaging channels 40 is controlled to emit the imaging beams while scanning along a scan path. In this example embodiment of the invention, the channel array is rotated with respect to matrix 20 to cause the pattern of red features 12D to be imaged with an effective pitch $P_{feff}$ that is equal to the effective pitch $P_{reff}$ of the matrix cells 34. As shown in FIG. 12, channel array 227B is rotated by angle $\theta_5$, which in this embodiment is measured from the sub-scan direction 44 to the axis 231 of the array 227B. The amount of required rotation of channel array 227B is dependant on the initial amount of skew between the matrix 20 and the channel array 227B. The initial skew alters the inherent pitch $P_r$ of the matrix cells to create an effective pitch $P_{reff}$. In this example embodiment of the invention, the effective pitch $P_{reff}$ is determined along a direction that is parallel to imaging line 243.

Figure 13:
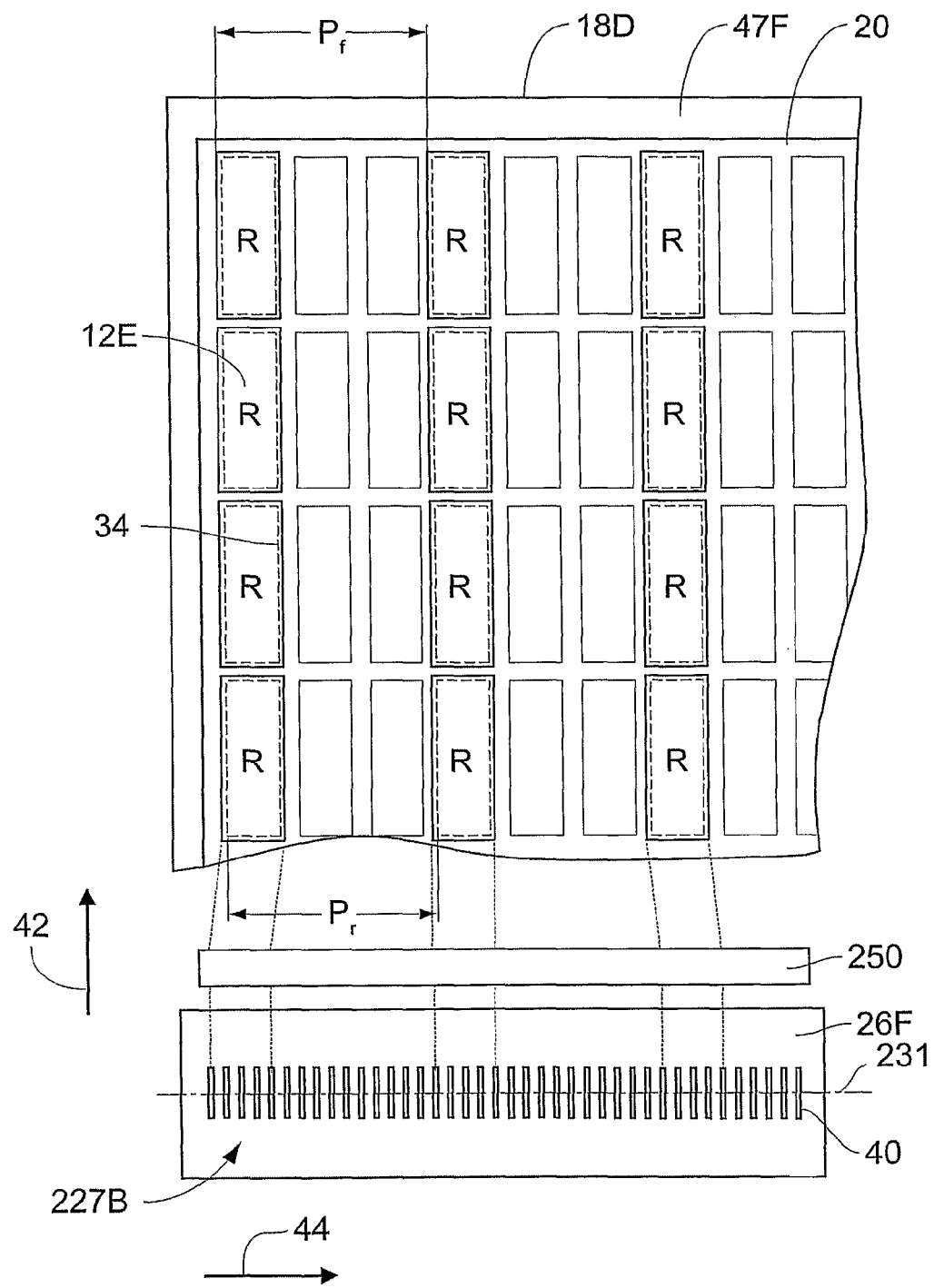
FIG. 13 is a schematic view of an imaging of the pattern of features of FIG. 11A as per an example embodiment of the invention that employs a zoom mechanism.

In this example embodiment of the invention matrix 20 is skewed. with The repeating pattern of red features 12D is also imaged in a skewed manner. Various example embodiments of the invention may image in a skewed manner by controlling the imaging beams emitted by imaging head 26E to image the edges of each feature with a stair-cased arrangement of imaged pixels. Another method for imaging the skewed edges of the features is to use coordinated motion. In some example embodiments of the invention, the channel array 227B is operable to direct imaging beams along a scan path, and matrix 20 is skewed with respect to the scan path. This skew alters the inherent pitch $P_r$ of the matrix cells to create an effective pitch $P_{reff}$ and a pattern of features is imaged with an effective pitch $P_{feff}$ that is equal to the effective pitch $P_{reff}$. The pattern of features can be imaged by rotating the channel array 227A to account for this skew. FIG. 13 schematically shows the imaging of the receiver element 18D shown in FIG. 11 as per another example embodiment of the invention. FIG. 13 shows only an imaging process related to the imaging of red features 12A. The green features 14A and blue features 16A have been omitted for the sake of clarity. Red features 12E are imaged with an imaging head 26F. In this example embodiment of the invention, imaging head 26F includes zoom mechanism 250. Zoom mechanism 250 adjusts a size of the imaging beams emitted by imaging head 26F such that a pattern of red features 12E are imaged with a pitch $P_f$ that is equal to the pitch $P_r$ of the matrix cells 34 onto which the red features 12E are imaged onto Zoom mechanism 250 can adjust a size of the imaging beams to adjust a size of pixels imaged by these beams. In the case where the matrix is skewed with respect to a scan path of imaging head 26F, zoom mechanism 250 can be operated to cause the pattern of red features 12E to be imaged with an effective pitch that is equal to the effective pitch $P_{reff}$ of the matrix cells.

Figure 14:
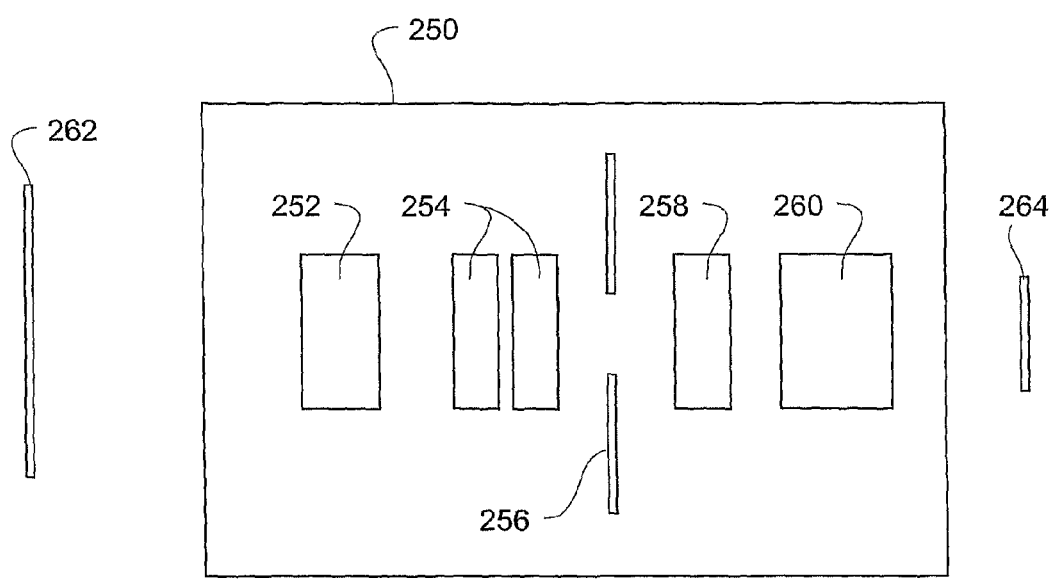
FIG. 14 is schematic representation of a zoom mechanism as per an example embodiment of the invention.

FIG. 14 schematically shows a zoom system 250 employed in an example embodiment of the invention. Zoom system 250 includes a fixed field optical component 252, two or more moving zoom optical components 254, an aperture stop 256, a fixed field component 258, and a moving focus optical component 260. In this example embodiment of the invention, aperture stop 256 is located between the moving zoom optical components and the fixed field optical components 252. Zoom mechanism 250 maintains the locations of the object plane 262 and image planes 264 through the zoom adjustment range. The location of the moving zoom optical components 254 are moved according to a schedule to set the magnification of the optical system. Each of the various optical components consist of one or more optical elements. One or more of the optical elements may be anamorphic. Other example embodiments of the invention can use other zoom mechanisms.

A pitch of the pattern of registration sub-regions (e.g. a matrix) can be determined in various ways, including by direct measurement. For example, beam finders can be used to determine an inherent or effective pitch of a pattern of registration sub-regions. Sizes of imaged pixels, imaging beams and/or an imaged swath can also be determined by measurement and can be used to help match the pitch of a repeating pattern of features to the pitch of a repeating pattern of registration sub-regions.

The size of pixels can be adjusted as per one or more example embodiments of the invention. In some example embodiments of the invention the size of pixel in a first direction is changed differently from the size of a pixel in a second direction. The second direction can be substantially perpendicular to the first direction. In some example embodiments of the invention, the size of a pixel in a sub-scan direction is changed differently from the size of a pixel in a main-scan direction. In some example embodiments of the invention the size characteristic of the pixel is adjusted to have different sizes in different directions. In some example embodiments of the invention, a characteristic of the pixel is adjusted in different directions by the different methods. In some example embodiments of the invention the size of a pixel is adjusted in a first direction independently of the size of the pixel in a second direction. In some example embodiments of the invention, the size of a pixel in a sub-scan direction is adjusted independently of a size of the pixel in a main-scan direction.

Once the orientation of various registration regions is known, repeating patterns of features are imaged in register with the registration regions as per step 350 in FIG. 5. Imaging can be accomplished in different manners. For example, referring to imaging apparatus 50 of FIG. 4, imaging is performed by positioning each of the imaging heads 26A and 26B along a sub-scan direction 44 to start positions retrieved from controller 60 as calculated from registration calculations. Receiver element 18A is positioned along main-scan direction 42 to start position provided by controller 60. This start position takes into account the distance required to accelerate to imaging speed. Apparatus 50 then accelerates receiver element 18A to the imaging speed. This moves receiver element 18A to the correct position at the correct velocity under imaging heads 26A and 26B. At the same time that receiver element 18A is being moved, each of the imaging heads 26A and 26B is moved along sub-scan direction 42 in a coordinated fashion. Imaging heads 26A and 26B are controlled to emit imaging beams towards receiver element 18A to form various imaged swaths. If each of the imaging heads 26A and 26B are imaging over different registration regions 47, the speed and activation timing for each imaging head is independent of the others. As imaging heads 26A and 26B complete their respective swaths, their main-scan motion is reversed and at the same time, the imaging heads 26 are moved a portion or all of a swath width along sub-scan direction 44. Imaging apparatus can image receiver element 18A in both directions of the main-scan motion. Other example embodiments of the invention can include other imaging methods.

Imaging heads 26 may comprise any suitable multi-channel imaging head having individually-addressable channels 40, each channel capable of producing an imaging beam having an intensity or power that can be controlled. Any suitable mechanism may be used to generate imaging beams. The imaging beams may be arranged in any suitable way.

Some embodiments of the invention employ infrared lasers. Infrared diode laser arrays employing 150 µm emitters with total power output of around 50 W at a wavelength of 830 nm, have been successfully used in the present invention. Alternative lasers including visible light lasers may also be used in practicing the invention. The choice of laser source employed may be motivated by the properties of the media to be imaged.

As shown in FIG. 4, data 63 representing feature patterns 30 is input to controller 60. Without limitation, a feature pattern 30 may represent a pattern of color features forming a portion of a color filter.

Various example embodiments of the invention have been described in terms of a laser induced thermal transfer processes in which an image forming material is transferred to a receiving element. Other example embodiments of the invention can be employed with other imaging methods and media. Images can be formed on media by different methods without departing from the scope of the present invention. For example, media can include an image modifiable surface, wherein a property or characteristic of the modifiable surface is changed when irradiated by an imaging beam to form an image. An imaging beam can be used to ablate a surface of media to form an image. Those skilled in the art will realize that different imaging methods can be readily employed.

A program product 67 can be used by controller 60 to perform various functions required by apparatus 50. One function includes setting control parameters for imaging heads 26 to register one or more repeating patterns of features 30 with one or more repeating registration patterns 36 of registration sub-regions. Without limitation, program product 67 may comprise any medium which carries a set of computer-readable signals comprising instructions which, when executed by a computer processor, cause the computer processor to execute a method as described herein. The program product 67 may be in any of a wide variety of forms. The program product 67 may comprise, for example, physical media such as magnetic storage media including floppy diskettes, hard disk drives, optical data storage media including CD ROMs, DVDs, electronic data storage media including ROMs, flash RAM, or the like. The instructions may optionally be compressed and/or encrypted on the medium.

For the methods described herein repeating patterns of features 30 can have the form of stripes that have edges aligned with main scan direction 42. Repeating patterns of features 30 can also include repeating patterns of island features. The invention is not limited to imaging rectangular shaped island features, however.

Features may be imaged in accordance with image data that includes halftone screening data. In halftone imaging, features comprise a pattern of elements known halftone dots. The halftone dots vary in size according to the desired lightness or darkness of the imaged feature. Each halftone dot is typically larger than pixels imaged by imaging head and is typically made up of a matrix of pixels imaged by a plurality of imaging channels. Halftone dots are typically imaged at a chosen screen ruling typically defined by the number of halftone dots per unit length and a chosen screen angle typically defined by an angle at which the halftone dots are oriented. In example embodiments of the invention, a feature may be imaged with a screen density in accordance with the corresponding halftone screen data chosen to image that feature.

In other example embodiments of the invention, a feature may be imaged with stochastic screen made up of a varying spatial frequency of equally sized dots. In yet other example embodiments of the invention, a feature may be imaged with a combined halftone and stochastic screen (commonly referred to as a "hybrid" screen).

Patterns of features have been described in terms of patterns of color features in a display. In some example embodiments of the invention, the features can be part of an LCD display. In other example embodiments of the inventions, the features can be part of an organic light-emitting diode (OLED) display. OLED displays can include different configurations. For example, in a fashion similar to an LCD display, different color features can be formed into a color filter used in conjunction with a white OLED source. Alternatively, different color illumination sources in the display can be formed with different OLED materials with various embodiments of the invention. In these embodiments, the OLED based illumination sources themselves control the emission of colored light without necessarily requiring a passive color filter. OLED materials can be transferred to suitable media. OLED materials can be transferred to a receiver element with laser-induced thermal transfer techniques.

While the invention has been described using as examples applications in display and electronic device fabrication, the methods described herein are directly applicable to imaging any patterns of features including those used in biomedical imaging for lab-on-a-chip (LOC) fabrication. LOC devices may include several repeating patterns of features. The invention may have application to other technologies, such as medical, printing and electronic fabrication technologies.

It is to be understood that the exemplary embodiments are merely illustrative of the present invention and that many variations of the above-described embodiments can be devised by one skilled in the art without departing from the scope of the invention. It is therefore intended that all such variations be included within the scope of the following claims and their equivalent.

What is claimed is:

1. A method for imaging with pixels a repeating pattern of features in aligned relationship to a registration region comprising a repeating pattern of sub-regions, the method comprising:
   determining a pitch of the repeating pattern of sub-regions;
   adjusting a size of the pixels;
   operating an imaging head comprising an array of individually addressable channels to direct imaging beams to form an image swath on a media, each of the imaging beams being operable for imaging the pixels on the media;
   while forming the image swath on the media, controlling the individually addressable channels to image the repeating pattern of features;
   adjusting a pitch of the repeating pattern of features to equal substantially the pitch of the repeating pattern of sub-regions in a direction generally perpendicular to the image swath; and
   wherein adjusting the pitch of the repeating pattern of features to equal substantially the pitch of the repeating patterns of sub-regions comprises rotating the array of individually addressable channels with respect to the repeating pattern of sub-regions.

2. A method according to claim 1, wherein determining the pitch of the repeating pattern of sub-regions comprises measuring the pitch of the repeating pattern of registration regions.

3. A method according to claim 1, wherein the imaging head is operable for controlling a plurality of the channels to direct imaging beams to form an imaging line, and the repeating pattern of sub-regions is skewed by an angle with respect to the imaging line, the method comprising additionally rotating imaging head to compensate for the angle.

4. A method according to claim 1, wherein the repeating pattern of features comprises a repeating pattern of color features of a color filter, and the registration region comprises a matrix.

5. A method according to claim 4, wherein the color filter includes a plurality of patterns of color features, each pattern of color features corresponding to a given color, the method comprising imaging each of the patterns of color features separately.

6. A method according to claim 1, wherein imaging the repeating pattern of features comprises imaging the repeating pattern of features in a laser-induced thermal transfer process.

7. The method according to claim 6, wherein the laser-induced thermal transfer process comprises a laser-induced dye transfer process.

8. A method according to claim 6, wherein the laser-induced thermal transfer process comprises a laser-induced mass transfer process.

9. A method according to claim 1, wherein imaging the repeating pattern of features comprises transferring an image forming material from a donor element to a receiver element.

10. A method according to claim 1, imaging the repeating pattern of features comprises transferring a colorant and a binder to the media.

11. A method according to claim 1, wherein imaging the repeating pattern of features comprises imaging a repeating pattern of island features.

12. A method according to claim 11 wherein the repeating pattern of island features comprises a first plurality of features of a first color, some features of the first plurality separated from some other features of the first color by a feature of a different color.

13. A method according to claim 11 wherein the repeating pattern of island features comprises a first plurality of features of a first color, some features of the first plurality separated from some features of the first color by a feature of a different color in a first direction.

14. A method according to claim 11 wherein the repeating pattern of island features comprises a first plurality of features of a first color, some features of the first plurality separated from some other features of the first color by a feature of a color other than the first color in a first direction and a second direction perpendicular to the first direction.

15. A method for imaging a repeating, pattern of features in aligned relationship to a registration region comprising a repeating pattern of sub-regions, the method comprising:
   determining a pitch of the repeating pattern of sub-regions;
   operating an imaging head comprising an array of individually addressable channels to direct imaging beams to form an image swath on a media;
   while forming the image swath on the media, controlling the individually addressable channels to image the repeating pattern of features;
   adjusting a pitch of the repeating pattern of features to equal substantially the pitch of the repeating pattern of sub-regions in a direction generally perpendicular to the image swath; and wherein adjusting the pitch of the repeating pattern of features to equal substantially the pitch of the repeating patterns of sub-regions comprises altering a size of the image swath with a zoom mechanism.

16. A method for imaging a repeating pattern of features in aligned relationship to a registration region comprising a repeating pattern of sub-regions, the method comprising:

determining a pitch of the repeating pattern of sub-regions;

operating an imaging head comprising an array of individually addressable channels to direct imaging beams to form an image swath on a media;

while forming the image swath on the media, controlling the individually addressable channels to image the repeating pattern of features;

adjusting a pitch of the repeating pattern of features to equal substantially the pitch of the repeating pattern of sub-regions in a direction generally perpendicular to the image swath;

comprising adjusting a size of the imaging beams to adjust the pitch of the repeating pattern of features to equal substantially the pitch of the repeating pattern of sub-regions; and comprising adjusting a size of the imaging beams with a zoom mechanism.

17. A method for imaging with pixels a repeating pattern of features in aligned relationship to a registration region comprising a repeating pattern of sub-regions, the method comprising:

determining a pitch of the repeating pattern of sub-regions;

adjusting a size of the pixels;

operating an imaging head comprising an array of individually addressable channels to direct imaging beams to form an image swath on a media, each of the imaging beams being operable for imaging the pixels on the media;

while forming the image swath on the media, controlling the individually addressable channels to image the repeating pattern of features;

adjusting a pitch of the repeating pattern of features to equal substantially the pitch of the repeating pattern of sub-regions in a direction generally perpendicular to the image swath; and wherein adjusting the size of the pixels comprises rotating the array of individually addressable channels with respect to the repeating pattern of sub-regions.

18. A method for imaging with pixels a repeating pattern of features in aligned relationship to a registration region comprising a repeating pattern of sub-regions, the method comprising:

determining a pitch of the repeating pattern of sub-regions;

adjusting a size of the pixels;

operating an imaging head comprising an array of individually addressable channels to direct imaging beams to form an image swath on a media, each of the imaging beams being operable for imaging the pixels on the media;

while forming the image swath on the media, controlling the individually addressable channels to image the repeating pattern of features;

adjusting a pitch of the repeating pattern of features to equal substantially the pitch of the repeating pattern of sub-regions in a direction generally perpendicular to the image swath; and comprising adjusting the size of the pixels with a zoom mechanism.

* * * * *